United States Patent
Kozuka

(10) Patent No.: US 6,531,690 B2
(45) Date of Patent: *Mar. 11, 2003

(54) PHOTOELECTRIC CONVERSION APPARATUS

(75) Inventor: Hiraku Kozuka, Hiratsuka (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/562,640

(22) Filed: May 2, 2000

(65) Prior Publication Data

US 2003/0020000 A1 Jan. 30, 2003

(30) Foreign Application Priority Data

May 7, 1999 (JP) ............ 11-127177

(51) Int. Cl.$^7$ ............................................. H01L 27/00
(52) U.S. Cl. ................................. 250/208.1; 358/474
(58) Field of Search ............................ 250/208.1, 234, 250/235; 358/474, 482, 494

(56) References Cited

U.S. PATENT DOCUMENTS

| | | | |
|---|---|---|---|
| 5,973,311 A | * 10/1999 | Sauer et al. | 250/208.1 |
| 5,998,779 A | 12/1999 | Kozuka | 250/208.1 |
| 6,118,115 A | 9/2000 | Kozuka et al. | 250/208.1 |

FOREIGN PATENT DOCUMENTS

| | | | |
|---|---|---|---|
| JP | 05-227362 | 9/1993 | H04N/1/028 |
| JP | 09-205588 | 8/1997 | H04N/5/335 |

* cited by examiner

*Primary Examiner*—Robert H. Kim
*Assistant Examiner*—Hoon K. Song
(74) *Attorney, Agent, or Firm*—Fitzpatrick, Cella, Harper & Scinto

(57) ABSTRACT

For implementing optional setting of resolutions in a main scanning direction and in a sub-scanning direction and attaining of higher recording speed in a low resolution mode, a photoelectric conversion apparatus is provided with a plurality of photodetectors arrayed in the main scanning direction and in the sub-scanning direction, and a resolution switching circuit for effecting switching between resolutions by selecting read signals to be read from the photodetectors arrayed in the main scanning direction and in the sub-scanning direction.

10 Claims, 19 Drawing Sheets

PHOTOELECTRIC CONVERSION APPARATUS

BACKGROUND OF THE INVENTION

1. Field of the Invention

The present invention relates to a photoelectric conversion apparatus and an image reading system and, more particularly, to one-dimensional and two-dimensional photoelectric conversion apparatuses each for reading an image, for example, of video cameras, digital cameras, facsimile machines, image scanners, digital copiers, X-ray image pickup apparatus, or the like, one-dimensional photoelectric conversion apparatus having a resolution switch function of switching between resolutions in the main scanning direction, and an image reading system having a resolution control means.

2. Related Background Art

In these years, equal-magnification contact type image sensors equipped with multiple semiconductor photosensor chips have actively been developed as one-dimensional image reading apparatus in the field of information processing systems.

For example, Japanese Patent Application Laid-Open No. 5-227362 suggests the contact type image sensor provided with a novel control terminal for control of resolution and permitting a user to switch between resolutions according to use conditions.

FIG. 1 shows a circuit diagram of an integrated circuit for the contact type image sensor suggested in the above application. In the prior art, the resolution switching between a high resolution mode and a low resolution mode is implemented by providing an image sensor chip with a control terminal 125 and allowing the user to enter a signal of a high level or a low level into the terminal.

The prior art, however, had the problem of incapability of achieving sufficient sensitivity and reading speed in the low resolution mode, because light-receiving elements (photodetectors) were arrayed at the pitch of the maximum resolution in the main scanning direction and in the sub-scanning direction.

For example, let us consider an example in which the photodetectors are arranged in the optical resolution of 600 dpi and in which the resolutions are 600 dpi in the high resolution mode and 300 dpi in the low resolution mode. In the prior art the resolutions are controlled by thinning-out a pixel only in the main scanning direction. Since the photodetectors are arranged in the resolution of 600 dpi in the sub-scanning direction, where scanning is conducted in the resolution of 300 dpi in the sub-scanning direction, the photoreceptive region used is only half of the effective photoreceptive region, thus leaving a useless area in the photoreceptive region. Therefore, the apparatus is unable to exhibit sufficient performance in the low resolution mode.

Specifically, supposing a certain 600 dpi-spec photoelectric conversion apparatus should require the storage time of 8 msec per line, a 300 dpi-spec photoelectric conversion apparatus having like charge detection sensitivity would have the photoreceptive area of four times that of the 600 dpi-spec apparatus (two times in the main scanning direction×two times in the sub-scanning direction). Thus the storage time per line of the 300 dpi-spec apparatus could be a quarter of that of the 600 dpi-spec apparatus; that is, the storage time per line of the 300 dpi-spec apparatus could be 2 msec.

In the case of the resolution switching by the prior art, however, because the photoreceptive area in the resolution of 300 dpi is double that in the resolution of 600 dpi even under the assumption that photocarriers in adjacent pixels can be added up, the storage time is half of that in the resolution of 600 dpi, i.e., 4 msec.

Further, since the above storage time per line is one of factors governing the read time in the photoelectric conversion apparatus constructed to perform signal reading operation during the storage period of light signal, for example, as suggested in Japanese Patent Application Laid-Open No. 9-205588, there arises a problem that the reading speed in the low resolution mode cannot be increased fully, in the photoelectric conversion apparatus with the resolution switching function according to the prior art.

SUMMARY OF THE INVENTION

An object of the present invention is to provide a photoelectric conversion apparatus and an image reading system permitting optional setting of resolutions in the main scanning direction and in the sub-scanning direction and also permitting attainment of higher reading speed in the low resolution mode.

In order to accomplish the above problem, according to aspect of the present invention, there is provided a photoelectric conversion apparatus comprising photoelectric conversion means comprising a plurality of photodetectors arrayed in a main scanning direction and in a sub-scanning direction, and resolution switch means for effecting switching between resolutions by selecting signals to be read from the plurality of light-receiving elements arrayed in the main scanning direction and in the sub-scanning direction.

According to another aspect of the present invention, there is also provided a photoelectric conversion apparatus comprising a plurality of photodetectors arrayed in a main scanning direction and in a sub-scanning direction, and control means for selecting a signal to be read from the photodetectors arrayed in the sub-scanning direction, in accordance with a resolution in the main scanning direction.

Further, according to another aspect of the present invention, there is provided an image reading system comprising the photoelectric conversion apparatus as described above, driving means for driving the photoelectric conversion means according to a resolution changeover signal, and processing means for processing output signals from the photoelectric conversion means.

The other objects and features of the present invention will become apparent in the description of embodiments which follows.

DESCRIPTION OF THE PREFERRED EMBODIMENTS

The embodiments of the present invention will be described hereinafter with reference to the drawings.

Embodiment 1 will be Described Below.

Figure 1:
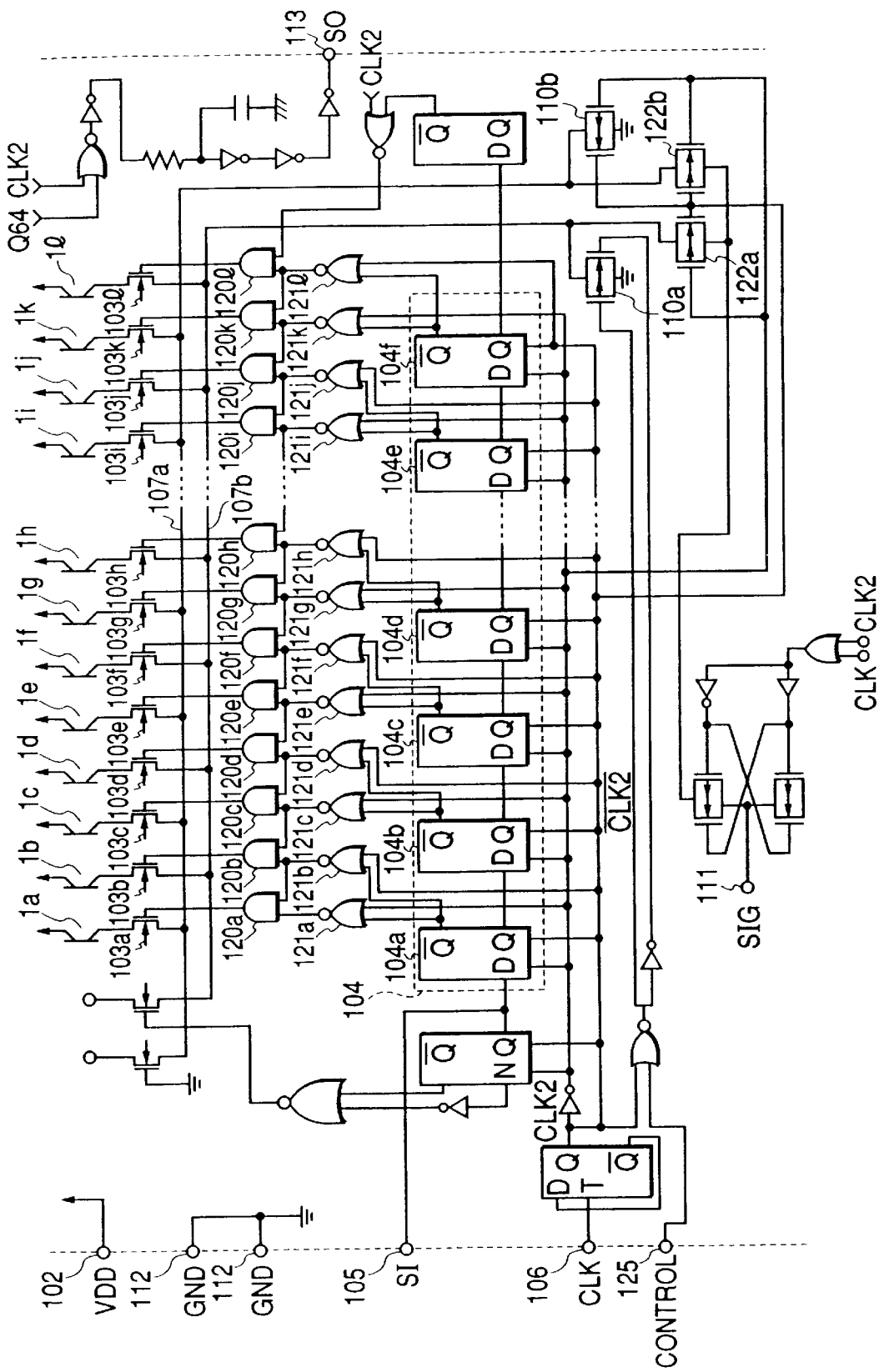
FIG. 1 is an equivalent circuit diagram of the photoelectric conversion apparatus according to the prior art.
Figure 2:
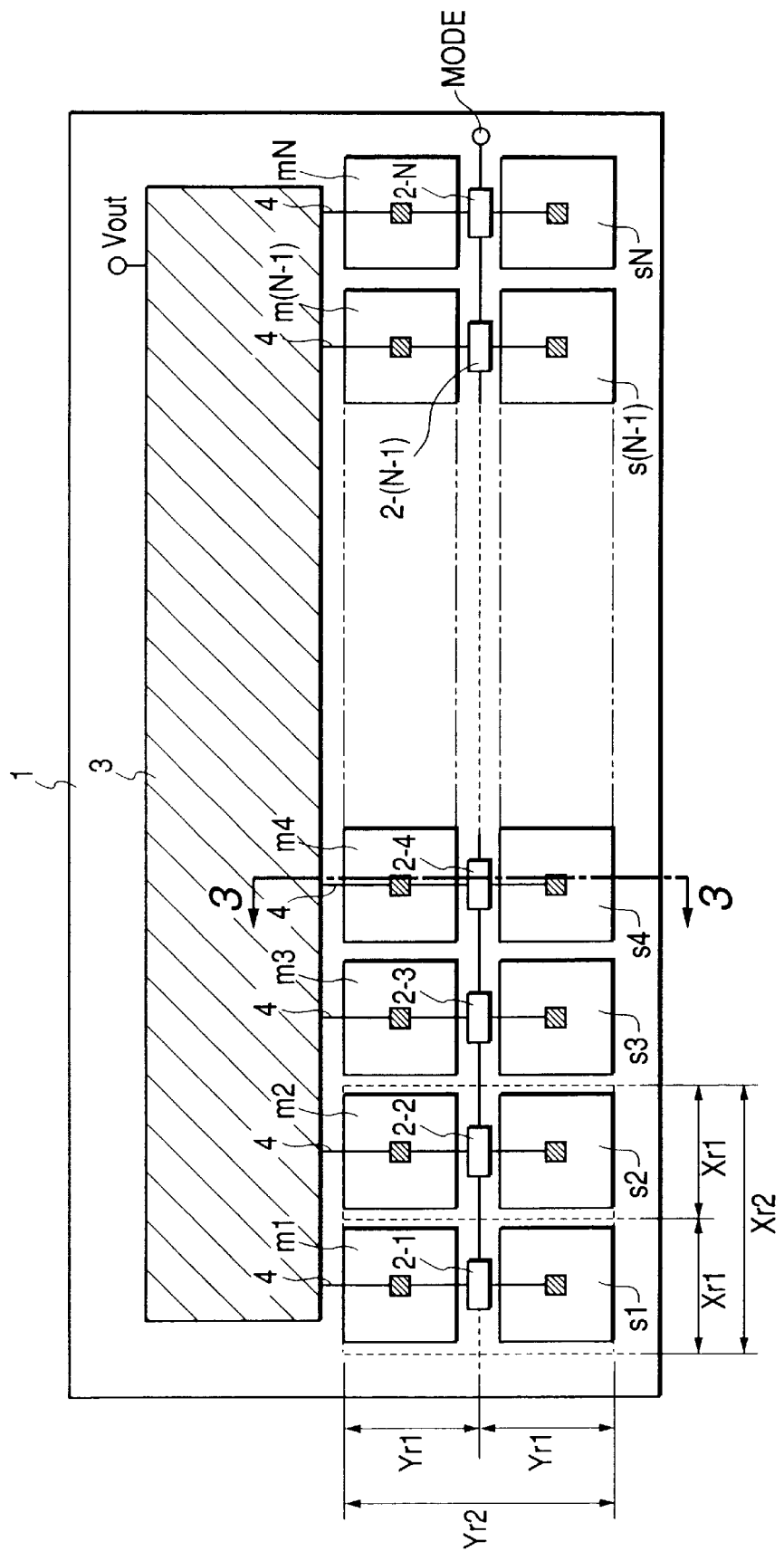
FIG. 2 is a schematic plan view of photodetector part of the photoelectric conversion apparatus in the first embodiment of the present invention.
Figure 3:
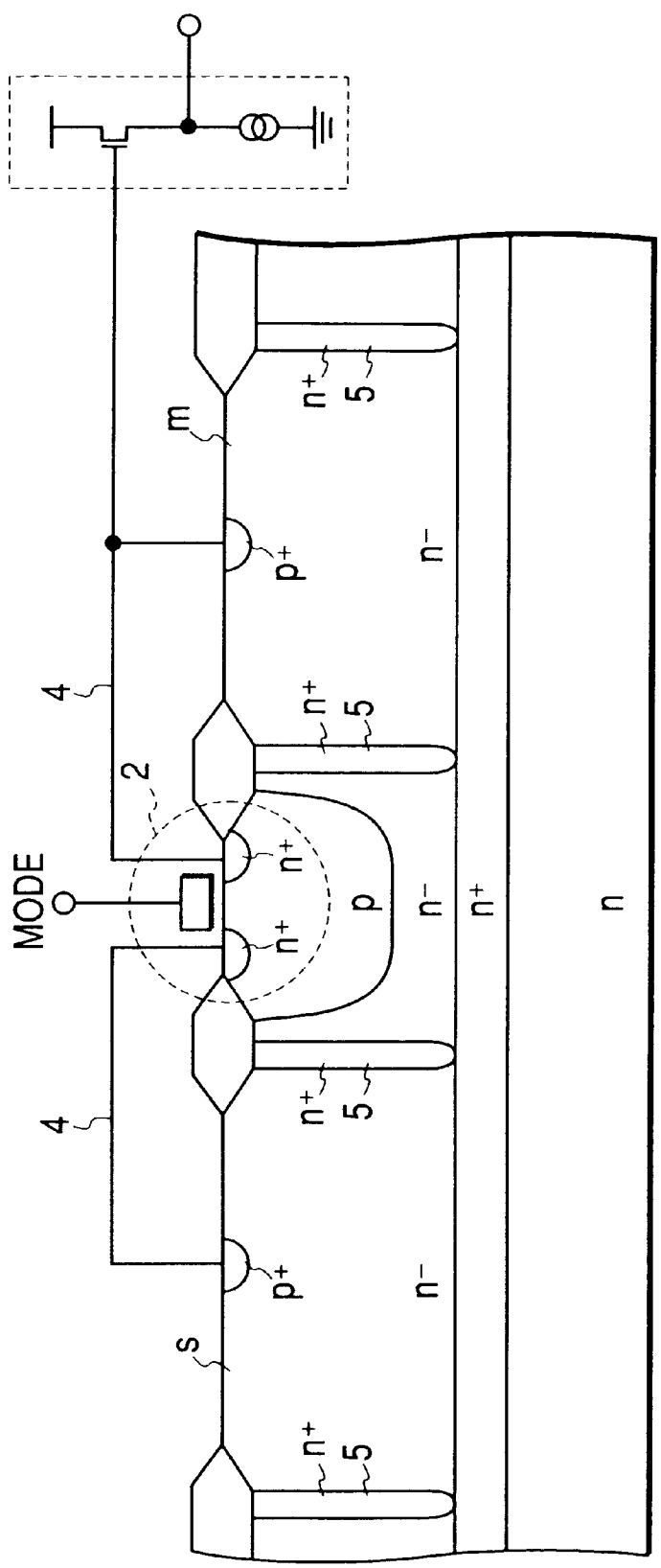
FIG. 3 is a structural diagram to show a cross section along a line 3—3 in FIG. 2.
Figure 4:
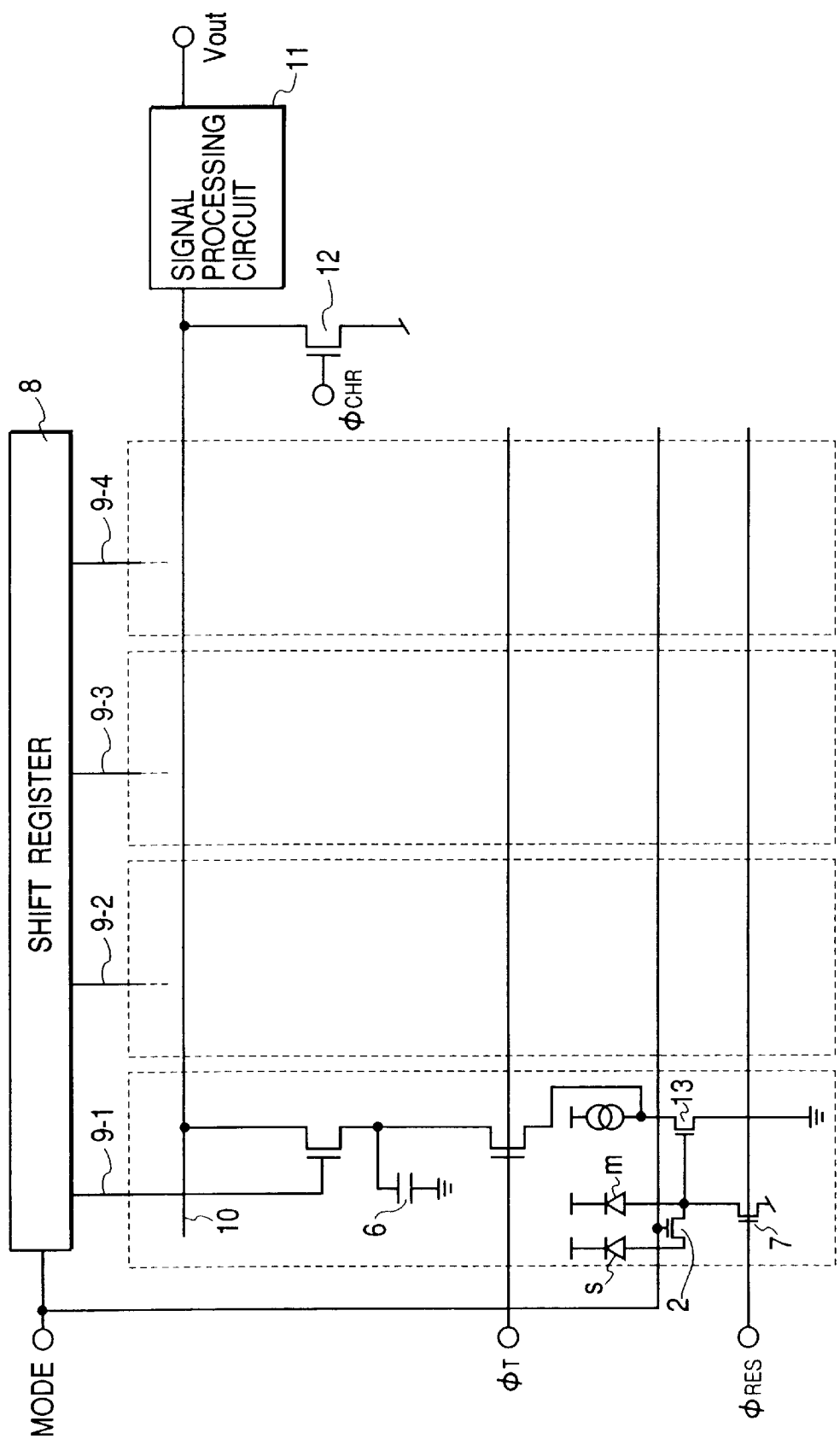
FIG. 4 is an equivalent circuit diagram (of four-pixel part) of the photoelectric conversion apparatus in the first embodiment of the present invention.

FIG. 2 is a schematic plan view of the photodetector part in the photoelectric conversion apparatus of the embodiment 1 of the present invention, FIG. 3 is a structural diagram to show a cross section along a line 3—3 in FIG. 2, and FIG. 4 is an equivalent circuit diagram of photodetectors (light-receiving elements) of four pixels in the photoelectric conversion apparatus. The present embodiment will be described as an example of the photoelectric conversion apparatus for the contact type image sensor having the resolution switching function between the high resolution of 600 dpi and the low resolution of 300 dpi.

In FIG. 2, the photoelectric conversion apparatus 1 is constructed in such structure that high-resolution photodetectors m1, m2, . . . , mN and low-resolution photodetectors s1, s2, . . . , sN are arranged at the pitch of Xr1 in the main scanning direction and at the pitch of Yr1 in the sub-scanning direction. In the present embodiment, the resolutions are 600 dpi in the high resolution mode and 300 dpi in the low resolution mode, and thus the following relations hold.

Xr1 Yr1 42.3 $\mu$m

Xr2 Yr2 84.6 $\mu$m

The high-resolution photodetector m1, m2, . . . , or mN and the low-resolution photodetector s1, s2, . . . , or sN in each pixel are connected via a sub-scanning resolution changeover means 2-1, 2-2, . . . , or 2-N by a wire 4 and the sub-scanning resolution changeover means 2-1, 2-2, . . . , and 2-N are controlled by a resolution control signal (MODE).

A light signal having undergone photoelectric conversion in each photodetector is processed by a signal processing and scanning means 3 and thereafter outputted through an output terminal (Vout).

FIG. 3 is the structural diagram to show the cross section along the line 3—3 in FIG. 2. The high-resolution photodetector m and low-resolution photodetector s are comprised of photodiodes having the $p^+/n^-$ junction. In the present embodiment, a substantial photoelectric conversion region in each photodetector is a portion defined by $n^+$ region 5 provided through $n^-$ region around $p^+$ region forming a photodiode. The $n^+$ regions 5 are regions for separating pixels one from another.

The high-resolution photodetector m and low-resolution photodetector s are electrically connected to each other via the wire 4 and an NMOS transistor as the sub-scanning resolution changeover means 2. Here the wires 4 can be those made of a wire material used in the ordinary semiconductor processes, for example, one selected from wire materials containing aluminum as a matrix, low-resistance materials containing silicon as a matrix, and so on. In the present embodiment the NMOS transistors are indicated as the sub-scanning resolution changeover means 2, but the changeover means may also be constructed in any other configuration for controlling electrical connection, for example, using PMOS transistors, analog switches, and so on.

FIG. 4 is the equivalent circuit diagram of the photoelectric conversion apparatus provided with the photodetectors illustrated in FIG. 2 and FIG. 3. FIG. 4 presents the illustration of only an equivalent circuit of one pixel with omitting the illustration for the other pixels. The operation of the present embodiment will be described referring to FIG. 4.

In the present embodiment, the apparatus is constructed so as to be in the high resolution mode with the resolution control signal (MODE) at the low level and be in the low resolution mode with the resolution control signal (MODE) at the high level.

When the resolution control signal (MODE) is at the low level, the apparatus is in the high resolution mode in which the NMOS transistors 2 as the sub-scanning resolution changeover means are in an off state. Therefore, only the high-resolution photodetector m is a photodetector to output a light signal. The light signal having undergone photoelectric conversion in the high-resolution photodetector m is read through a source follower 13 into a holding capacitor 6 and thereafter the high-resolution photodetector m is reset by a reset switch 7. Then storage is started again. On the other hand, the light signal read into the holding capacitor 6 is then read into a common output line 10 by a shift register 8 to be subjected to signal processing in a signal processing circuit 11, and thereafter the signal is outputted through the output terminal Vout.

In the present embodiment the shift register 8 is configured so as to sequentially scan the pixels one by one in the high resolution mode. Specifically, a shift register output line 9-1 of the first pixel is first made active, thereafter the common output line 10 is reset by a reset switch 12, and then a shift register output line 9-2 of the second pixel is made active. Such operation is repeated up to reading of the last pixel. In this case, the apparatus can implement scanning in the resolution of 600 dpi both in the main scanning direction and in the sub-scanning direction.

Next, when the resolution control signal (MODE) is at the high level, each NMOS transistor 2 as the sub-scanning resolution changeover means is switched on, so that the light signals are outputted from the high-resolution photodetector m and from the low-resolution photodetector s. The light signals having undergone the photoelectric conversion in the high-resolution photodetector m and in the low-resolution photodetector s are similarly read through the source follower 13 into the holding capacitor 6, thereafter the high-resolution photodetector m and the low-resolution photodetector s are reset by the reset switch 7, and then storage of charge is started again. On the other hand, the light signal read into the holding capacitor 6 is then read into the common output line 10 by the shift register 8 to be subjected to signal processing in the signal processing circuit 11, and thereafter the signal is outputted through the output terminal Vout.

In the present embodiment, the shift register 8 is configured so as to sequentially scan the pixels two by two in the low resolution mode. Specifically, the shift register output line 9-1 of the first pixel and the shift register output line 9-2 of the second pixel are made active simultaneously to output a signal of the first pixel.

After that, the common output line 10 is reset by the reset switch 12, and then the shift register output line 9-3 of the third pixel and the shift register output line 9-4 of the fourth pixel are made active to output a signal of the second pixel. This operation is repeated up to reading of the last pixel. In this case, the number of read pixels is half of that in the high resolution mode and thus the apparatus can implement scanning in the resolution of 300 dpi both in the main scanning direction and in the sub-scanning direction.

Now let us make comparison between charge storage time of the photoelectric conversion apparatus of the present embodiment and charge storage time of the photoelectric conversion apparatus of the resolution changeover method without provision of the low-resolution photodetectors s. In the photoelectric conversion apparatus of the present embodiment, light output per unit charge, i.e., charge detection sensitivity R can be expressed by the following equation.

$$R = 1/CPD \times GSF \times CT/(CT+CH) \times GAMP$$

where
- CPD: capacitance at photoreceptive part (capacitance at the gate part of the photodiode 2)
- GSF: source follower gain
- CT: capacitance at holding capacitor
- CH: capacitance at common output line
- GAMP: gain of signal processing circuit part.

The light output Vp can be expressed by the following equation.

$$Vp \propto L \times SPD \times ts \times R$$

where
- L: quantity of incident light per unit area
- SPD: area of photoreceptive part.

Thus, where the quantity of incident light, source follower gain, and amplifier gain are constant, the storage time ts necessary for a given light output is given as follows.

$$ts \propto 1/(L \times SPD \times R) \; CPD/(SPD \times CT/(CT+CH))$$

The following table presents comparison of the capacitance at the photoreceptive part, the capacitance at the holding capacitor, the capacitance at the common output line, the area of the photoreceptive part, and the storage time necessary for obtaining the light output of 1 V in the high resolution mode with those in the low resolution mode of the present embodiment and the prior art.

TABLE 1

|  | High resolution mode | Low resolution mode of the prior art | Low resolution mode of the present embodiment |
|---|---|---|---|
| capacitance at photoreceptive part CPD | 40 pF | 40 pF | 50 pF |
| capacitance at holding capacitor CT | 5 pF | 10 pF | 10 pF |
| capacitance at common output line CH | 5 pF | 5 pf | 5 pF |
| capacitance-divided gain CT/(CT + CH) | 0.50 | 0.67 | 0.67 |
| relative ratio of area of photoreceptive part | 1.0 | 1.0 | 1.9 |
| storage time | 10 msec | 7.5 msec | 4.9 msec |
| relative ratio of storage time | 1.00 | 0.75 | 0.49 |

It is seen from Table 1 that with the photodetectors of the photoelectric conversion apparatus of the present embodiment the charge storage time is 0.65 times that of the prior art and thus the reading speed per line can be about 1.5 times faster and that the photodetectors of the photoelectric conversion apparatus of the present embodiment are very effective in decreasing the storage time, i.e., in increasing the reading speed.

In the present embodiment the apparatus exemplified was the photoelectric conversion apparatus used in the contact type image sensor, but the present invention can also be applied to the photoelectric conversion apparatus for demagnifying optical systems in which the pixels are arranged at the pitch of several $\mu$m to several ten $\mu$m.

The photodetectors can not be applied only to the photoelectric conversion apparatus for monochromatic images, but can also be applied to the photoelectric conversion apparatus for color images according to the light source changeover method and the photoelectric conversion apparatus for color images provided with a color filter.

Further, the present embodiment shows the example of the apparatus in which the resolution in the low resolution mode was half of that in the high resolution mode, but, for example, a configuration in which the resolution in the low resolution mode is one third of that in the high resolution mode, can also be implemented by modifying the size of the low-resolution photodetectors in the sub-scanning direction. Namely, three pixels are provided in the sub-scanning direction and signals of totally nine pixels, three pixels in the main scanning direction and three pixels in the sub-scanning direction, are added up in the low resolution mode. It is also noted that the resolution switching is not limited to the two types of resolutions, but the present invention can also be applied to the resolution switching of three types of resolutions, for example.

Embodiment 2 will be Described Below.

Figure 5:
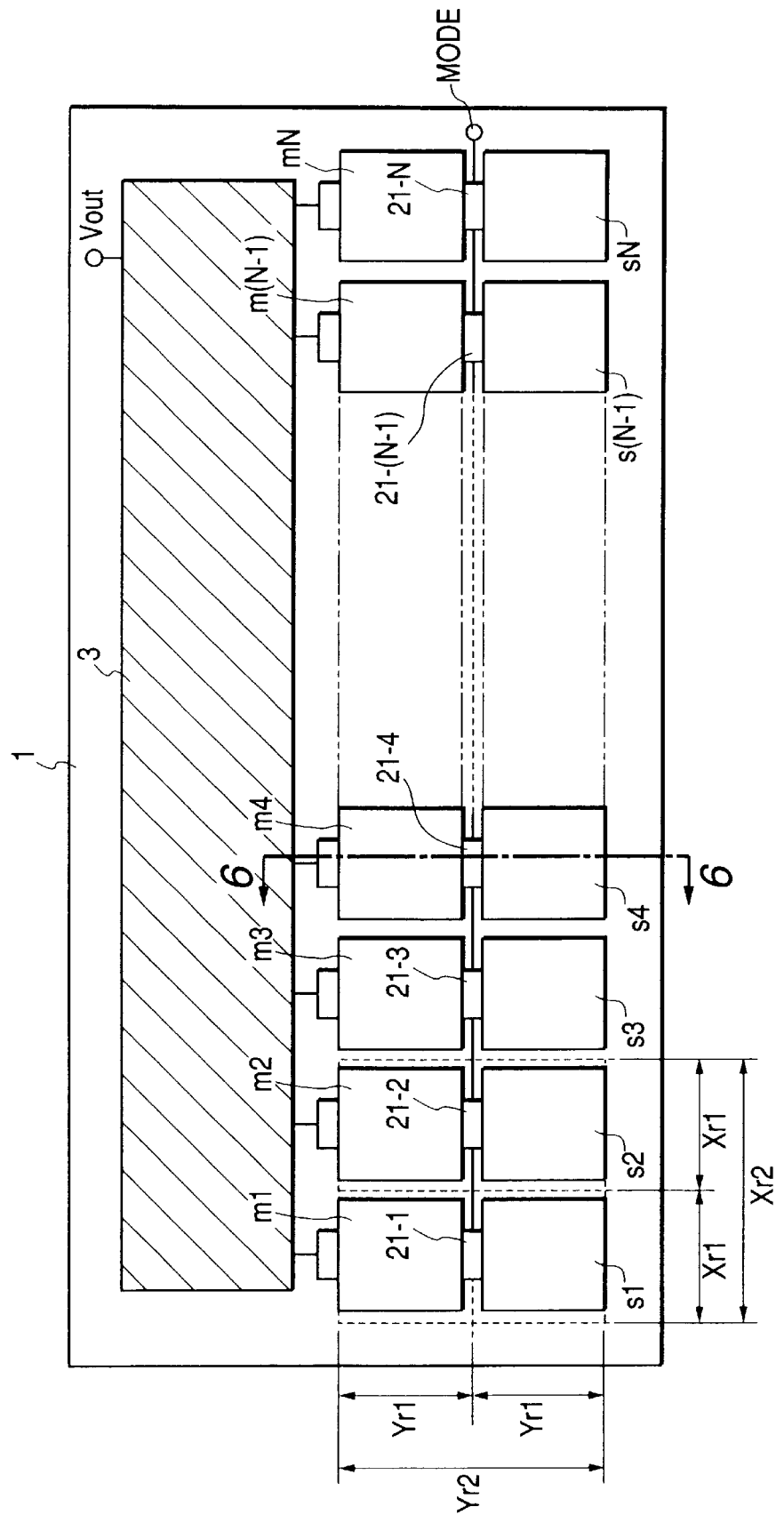
FIG. 5 is a schematic plan view of photodetector part of the photoelectric conversion apparatus in the second embodiment of the present invention.
Figure 6:
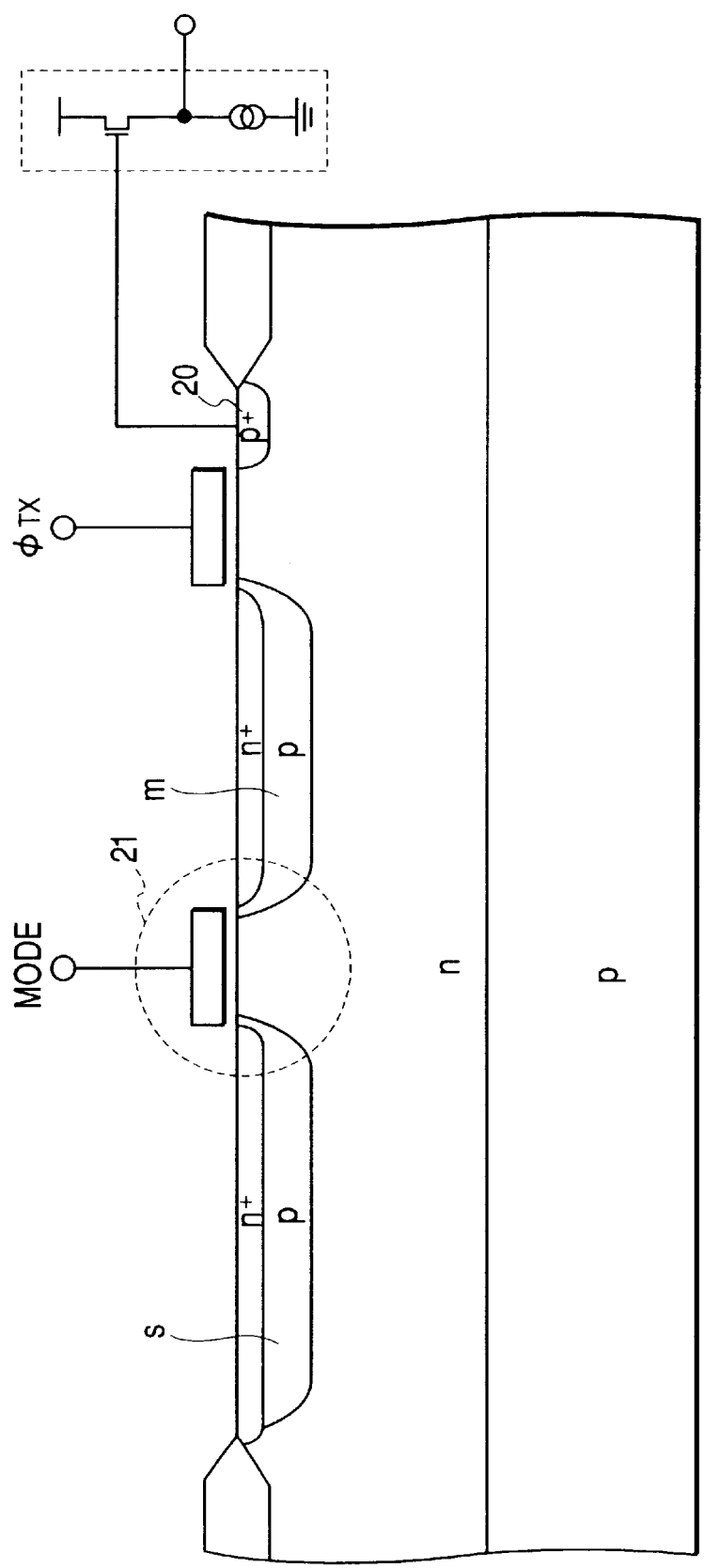
FIG. 6 is a structural diagram to show a cross section along a line 6—6 in FIG. 5.
Figure 7:
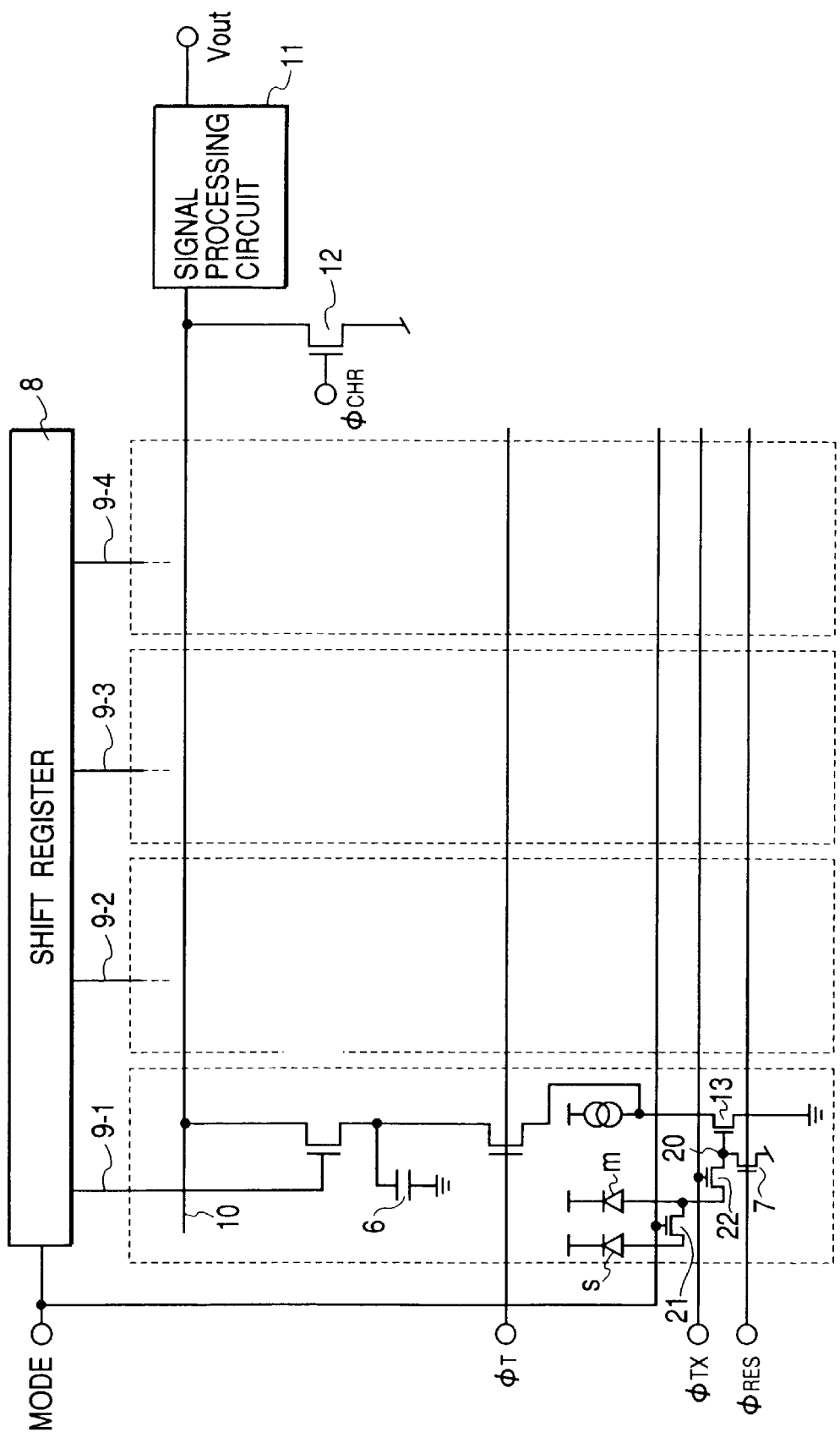
FIG. 7 is an equivalent circuit diagram (of four-pixel part) of the photoelectric conversion apparatus in the second embodiment of the present invention.

FIG. 5 is a schematic plan view of the photodetector part in the photoelectric conversion apparatus of the embodiment of the present invention, FIG. 6 is a structural diagram to show a cross section along a line 6—6 in FIG. 5, and FIG. 7 is an equivalent circuit diagram of photodetectors of four pixels in the photoelectric conversion apparatus. The present embodiment will be described as to the photoelectric conversion apparatus for the contact type image sensor having the resolution switching function between the high resolution of 1200 dpi and the low resolution of 600 dpi.

In FIG. 5, the photoelectric conversion apparatus 1 is constructed in such structure that the high-resolution photodetectors m1, m2, . . . , mN and low-resolution photodetectors s1, s2, . . . , sN are arranged at the pitch of Xr1 in the main scanning direction and at the pitch of Yr1 in the sub-scanning direction. In the present embodiment, the resolutions are 1200 dpi in the high resolution mode and 600 dpi in the low resolution mode, and thus the following relations hold.

$$Xr1\ Yr1\ 21.2\ \mu m$$

$$Xr2\ Yr2\ 42.3\ \mu m$$

The high-resolution photodetector m1, m2, . . . , or mN and the low-resolution photodetector s1, s2, . . . , or sN in each pixel are connected via a sub-scanning resolution changeover means 21-1, 21-2, . . . , or 21-N and the sub-scanning resolution changeover means 21-1, 21-2, . . . , and 21-N are controlled by the resolution control signal (MODE).

A light signal having undergone photoelectric conversion in each photodetector is processed by the signal processing and scanning means 3 and thereafter outputted through an output terminal (Vout).

FIG. 6 is the structural diagram to show the cross section along the line 6—6 in FIG. 5. In the present embodiment each photodetector is comprised of a photodiode having the $n^+/p/n$ junction. In the present embodiment, a substantial photoelectric conversion region is a portion defined by the p region forming each photodiode. In the present embodiment signal carriers having undergone photoelectric conversion in each photodiode are transferred to the pa region as a floating diffusion region 20.

The high-resolution photodetector m and the low-resolution photodetector s are electrically connected to each other through the sub-scanning resolution control means (transfer switch) 21. With MODE at the high level, the transfer switch 21 is off, and thus photocarriers of only the high-resolution photodetector m are transferred to the floating diffusion region 20 by a read pulse ($\Phi TX$).

With MODE at the low level, the transfer switch 21 is switched into an on state, photocarriers having undergone photoelectric conversion in the high-resolution photodetector m and in the low-resolution photodetector s are transferred to the floating diffusion region 20 by a read pulse ($\Phi TX$).

FIG. 7 is the equivalent circuit diagram of the photoelectric conversion apparatus provided with the photodetectors illustrated in FIG. 5 and FIG. 6. FIG. 7 presents the illustration of only an equivalent circuit of one pixel with omitting the illustration for the other pixels. The operation of the present embodiment will be described referring to FIG. 7.

In the present embodiment, the apparatus is constructed so as to be in the high resolution mode with the resolution control signal (MODE) at the high level and be in the low resolution mode with the resolution control signal (MODE) at the low level.

When the resolution control switch (MODE) is at the high level, each transfer switch 21 as the sub-scanning resolution changeover means is in the off state, and thus only the high-resolution photodetector m is a photodetector to output a light signal. The photocarriers having undergone photoelectric conversion in the high-resolution photodetector m are transferred through the transfer switch 22 to the floating diffusion region 20.

Then the photocarriers are subjected to charge-voltage conversion in the source follower 13 and thereafter the signal is read into the holding capacitor 6. After that, the floating diffusion region 20 is reset by the reset switch 7 and then storage is started again. On the other hand, the signal read into the holding capacitor is then read into the common output line 10 by the shift register 8 to be subjected to signal processing in the signal processing circuit 11, and thereafter the signal is outputted through the output terminal Vout.

In the present embodiment the shift register 8 is configured so as to sequentially scan the pixels one by one in the high resolution mode. Specifically, the shift register output line 9-1 of the first pixel is first made active, thereafter the common output line 10 is reset by the reset switch 12, and then the shift register output line 9-2 of the second pixel is made active. Such operation is repeated up to reading of the last pixel. In this case, the apparatus can implement scanning in the resolution of 1200 dpi both in the main scanning direction and in the sub-scanning direction.

Next, when the resolution control signal (MODE) is at the low level, each transfer switch 21 as the sub-scanning resolution changeover means is switched on, so that the light signals are outputted from the high-resolution photodetector m and from the low-resolution photodetector s. The photocarriers having undergone the photoelectric conversion in the high-resolution photodetector m and in the low-resolution photodetector s are similarly read through the source follower 13 into the holding capacitor 6.

After that, the floating diffusion region 20 is reset by the reset switch 7, and then storage of charge is started again. On the other hand, the light signal read into the holding capacitor 6 is then read into the common output line 10 by the shift register 8 to be subjected to signal processing in the signal processing circuit 11, and thereafter the signal is outputted through the output terminal Vout.

In the present embodiment, the shift register 8 is configured so as to sequentially scan the pixels two by two in the low resolution mode. Specifically, the shift register output line 9-1 of the first pixel and the shift register output line 9-2, of the second pixel are made active simultaneously to output a signal of the first pixel. After that, the common output line 10 is reset by the reset switch 12, and then the shift register output line 9-3 of the third pixel and the shift register output line 9-4 of the fourth pixel are made active to output a signal of the second pixel.

This operation is repeated up to reading of the last pixel. In this case, the number of read pixels is half of that in the high resolution mode and thus the apparatus can implement scanning in the resolution of 600 dpi both in the main scanning direction and in the sub-scanning direction.

Now let us make comparison of the storage time of the photoelectric conversion apparatus of the present embodiment with that of the photoelectric conversion apparatus of the resolution changeover method without provision of the low-resolution photodetectors s.

In the photoelectric conversion apparatus of the present embodiment, the light output per unit charge, i.e., charge detection sensitivity R can be expressed by the following equation.

$$R = 1/CFD \times GSF \times CT/(CT+CH) \times GAMP$$

where
CFD: capacitance at the floating diffusion part
GSF: source follower gain
CT: capacitance at the holding capacitor
CH: capacitance at the common output line
GAMP: gain of the signal processing circuit part.

The light output Vp can be expressed by the following equation.

$$Vp \, L \times SPD \times ts \times R$$

where
L: quantity of incident light per unit area
SPD: area of photoreceptive part.

Therefore, where the quantity of incident light, source follower gain, and amplifier gain are constant, the storage time ts necessary for a given light output is given as follows.

$$ts \, 1/(L \times SPD \times R) \, CFD/(SPD \times CT/(CT+CH))$$

The following table presents comparison of the capacitance at the photoreceptive part, the capacitance at the holding capacitor, the capacitance at the common output line, the area of the photoreceptive part, and the storage time necessary for obtaining the light output of 1 V in the high resolution mode with those in the low resolution mode of the present embodiment and the prior art.

TABLE 2

|  | High resolution mode | Low resolution mode of the prior art | Low resolution mode of the present embodiment |
|---|---|---|---|
| capacitance at FD part CFD | 20 pF | 20 pF | 20 pF |
| capacitance at holding capacitor CT | 10 pF | 20 pF | 20 pF |
| capacitance at common output line CH | 8 pF | 8 pF | 8 pF |
| capacitance-divided gain CT/(CT + CH) | 0.56 | 0.71 | 0.71 |
| relative ratio of area of photoreceptive part | 1.0 | 1.0 | 2.0 |
| storage time | 10 msec | 7.9 msec | 3.9 msec |
| relative ratio of storage time | 1.00 | 0.79 | 0.39 |

It is seen from Table 2 that with the photodetectors of the photoelectric conversion apparatus of the present embodiment the charge storage time is 0.49 times that of the prior art and thus the reading speed per line can be about 2 times faster and that the present embodiment is very effective in decreasing the storage time, i.e., in increasing the reading speed.

Embodiment 3 will be Described Below.

Figure 8:
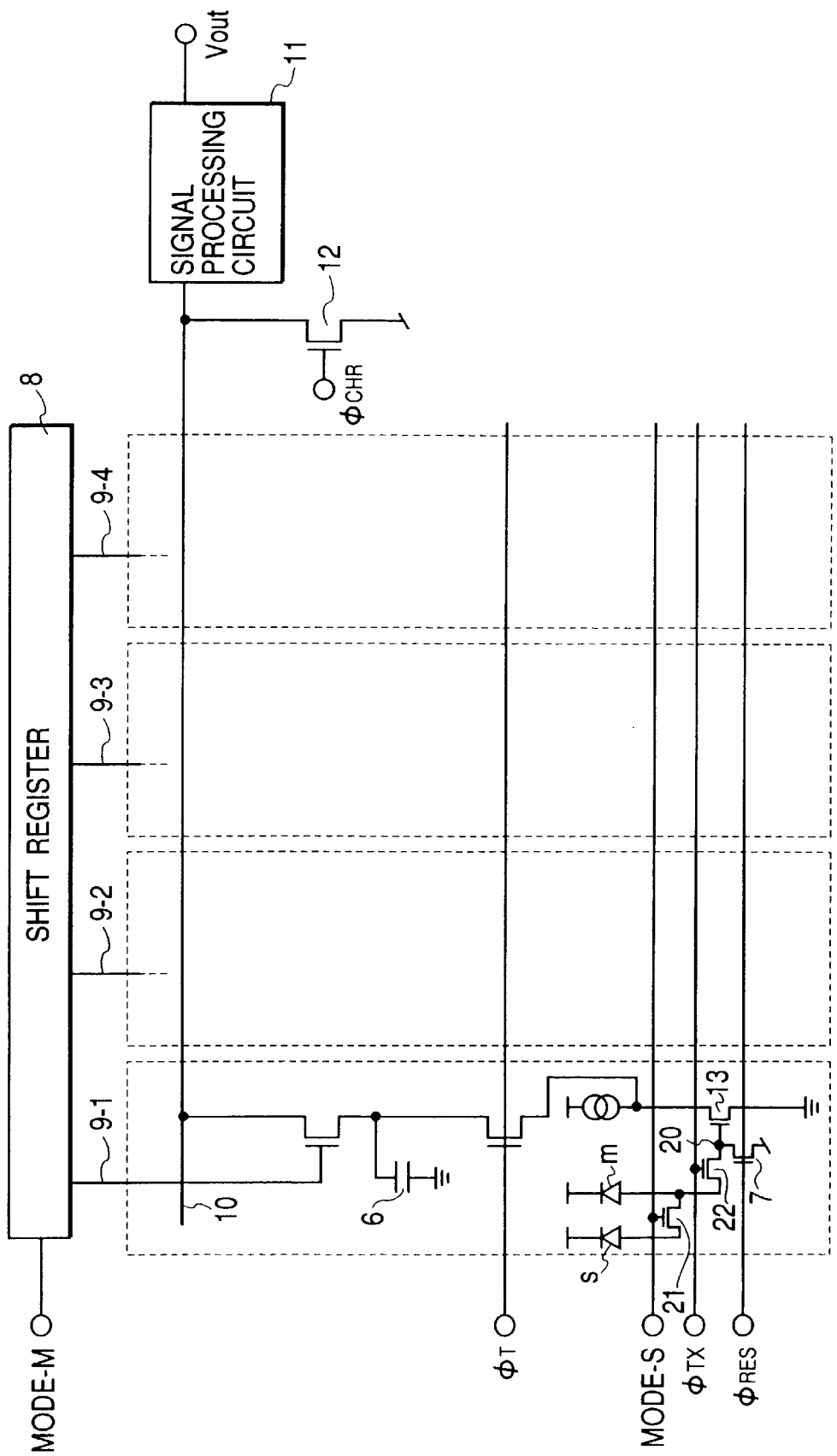
FIG. 8 is an equivalent circuit diagram (of four-pixel part) of the photoelectric conversion apparatus in the third embodiment of the present invention.

FIG. 8 is an equivalent circuit diagram of the photodetectors of four pixels in the photoelectric conversion apparatus of the present embodiment. The present embodiment is the photoelectric conversion apparatus with the resolution changeover function permitting optional switching between resolutions in the main scanning direction and in the sub-scanning direction. FIG. 8 is the equivalent circuit diagram to show four pixels in the present embodiment, and it is noted that FIG. 8 presents the illustration of only the equivalent circuit of one pixel with omitting the illustration for the other pixels.

The operation of the present embodiment will be described below referring to FIG. 8.

In the present embodiment, the apparatus is provided with a main scan resolution control signal terminal (MODE_M) and a sub-scan resolution control signal terminal (MODE_S) and the resolutions in the main scanning direction and in the sub-scanning direction can be controlled independently of each other by combinations of levels of the terminals.

In the present embodiment, the apparatus is constructed so as to be in the high resolution mode when the both resolution control signals for the main scanning direction and for the sub-scanning direction are at the high level, and so as to be in the low resolution mode when the both signals are at the low level.

The present embodiment is similar to Embodiment 2 except that the resolution control signals are provided independently of each other for the main scanning direction and for the sub-scanning direction and that the resolutions are 600 dpi in the high resolution mode and 300 dpi in the low resolution mode.

The following table presents a comparison example of the relation between resolution control signals and resolutions, and the reading speed per line in the present embodiment.

TABLE 3

| Main scan resolution control signal (MODE_M) | sub-scan resolution control signal (MODE_S) | main scan resolution | sub-scan resolution | read speed (msec) present embodiment | prior art |
|---|---|---|---|---|---|
| H | H | 600 dpi | 600 dpi | 5.0 | 5.0 |
| H | L | 600 dpi | 300 dpi | 2.5 | 5.0 |
| L | H | 300 dpi | 600 dpi | 4.0 | 4.0 |
| L | L | 300 dpi | 300 dpi | 2.0 | 4.0 |

As seen from Table 3, the photoelectric conversion apparatus of the present embodiment is constructed so as to permit optional switching between the resolutions in the main scanning direction and in the sub-scanning direction. Further, it can accomplish the higher reading speed, particularly, in the low resolution mode along the sub-scanning direction, as compared with the prior art.

Embodiment 4 will be Described Below.

Figure 9:
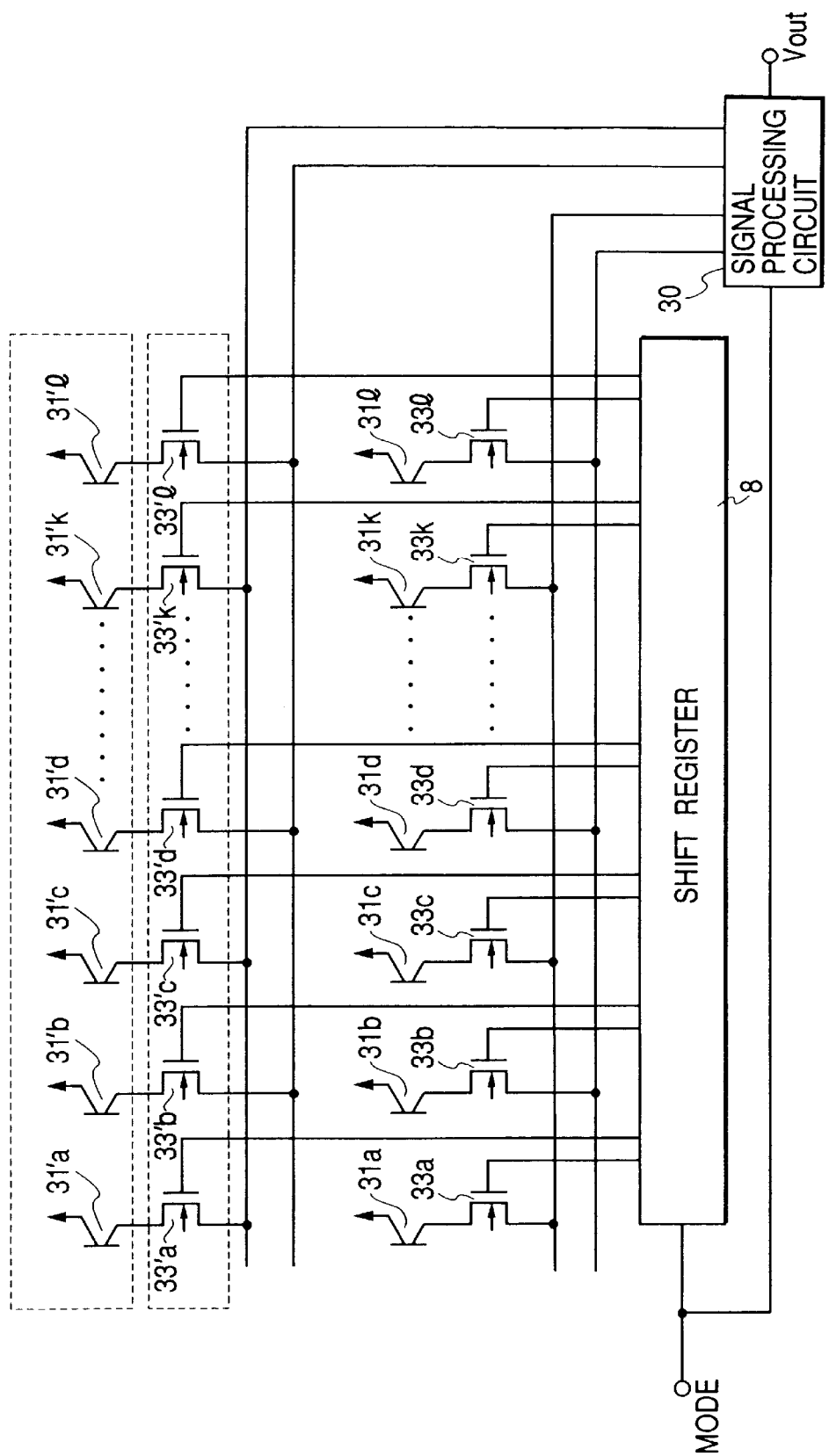
FIG. 9 is an equivalent circuit diagram of the photoelectric conversion apparatus in the fourth embodiment of the present invention.

FIG. 9 is an equivalent circuit diagram of the photoelectric conversion apparatus of the present embodiment. The present embodiment illustrates the photoelectric conversion apparatus of a current read type using phototransistors as the photodetectors.

In the present embodiment the photodetectors are high-resolution phototransistors 31'a to 31l and low-resolution phototransistors 31'a to 31'l. Here each group of the phototransistors 31'a to 31l and the phototransistors 31'a to 31'l are arranged in the resolution of 300 dpi in the main scanning direction and in the sub-scanning direction. In the present embodiment, therefore, the resolutions in the main scanning direction and in the sub-scanning direction are 300 dpi in the high resolution mode and 150 dpi in the low resolution mode.

Each of the high-resolution phototransistors 31a to 31l and the low-resolution phototransistors 31'a to 31'l is provided with a read switch 33a to 33l, 33'a to 33'l, and they are successively activated by the shift register 8 to sequentially read photocurrents of the high-resolution phototransistors 31a to 31l and the low-resolution phototransistors 31'a to 31'l.

The shift register 8 is controlled by the resolution changeover control signal (MODE), and in the low resolution mode the high-resolution phototransistor and the low-resolution phototransistor both are read simultaneously in each pixel, including an adjacent pixel. A light signal read out of each phototransistor is subjected to current-voltage conversion in the signal processing circuit 30 to be outputted through the output terminal (VOUT). The resolution control signal (MODE) is also supplied to the signal processing circuit 30 and the signal processing circuit 30 performs an addition process of the photocurrents read out of the high-resolution phototransistors 31a to 31l and the low-resolution phototransistors 31'a to 31'l according to the resolution.

In the present embodiment the photoreceptive area in the low resolution mode can be four times that in the high resolution mode. Therefore, the reading speed in the low resolution mode of the present embodiment can be two times that in a case in which the output involves addition of only an adjacent pixel, without provision of the low-resolution phototransistors 31'a to 31'l.

As described above, the present embodiment exhibits its effect when applied not only to the photoelectric conversion apparatus of the batch reading method, but also to the photoelectric conversion apparatus of the sequential reading method.

Embodiment 5 will be Described Below.

Figure 10:
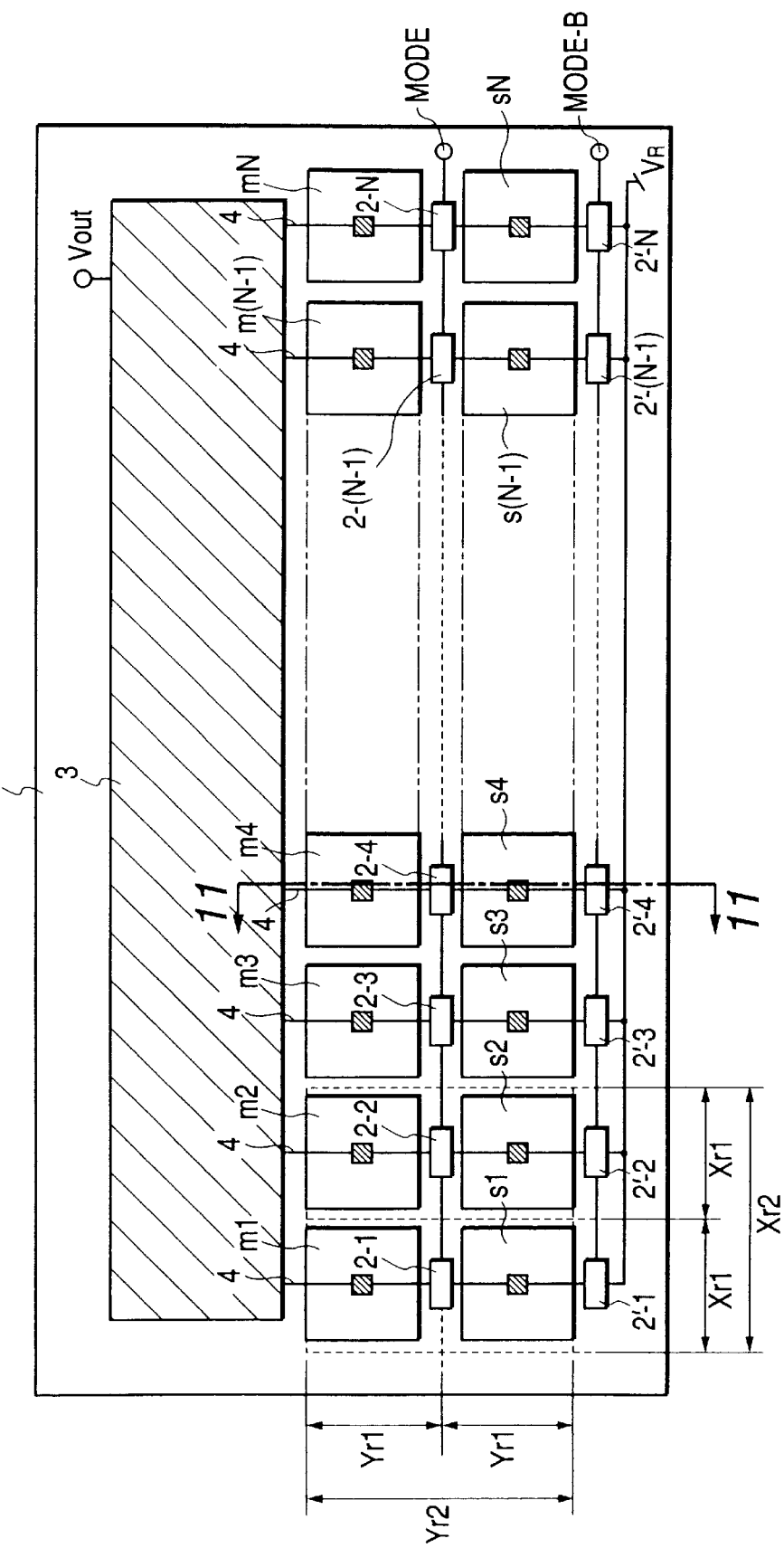
FIG. 10 is a schematic plan view of photodetector part of the photoelectric conversion apparatus in the fifth embodiment of the present invention.
Figure 11:
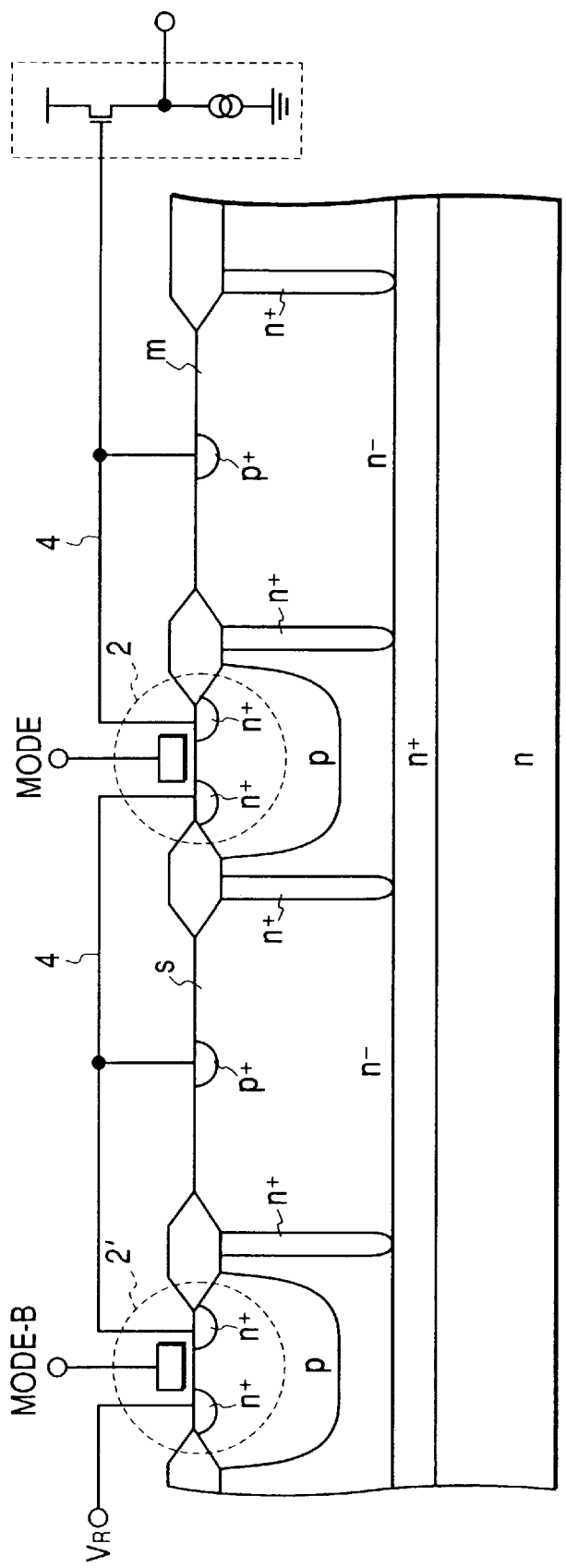
FIG. 11 is a structural diagram to show a cross section along a line 11—11 in FIG. 10.
Figure 12:
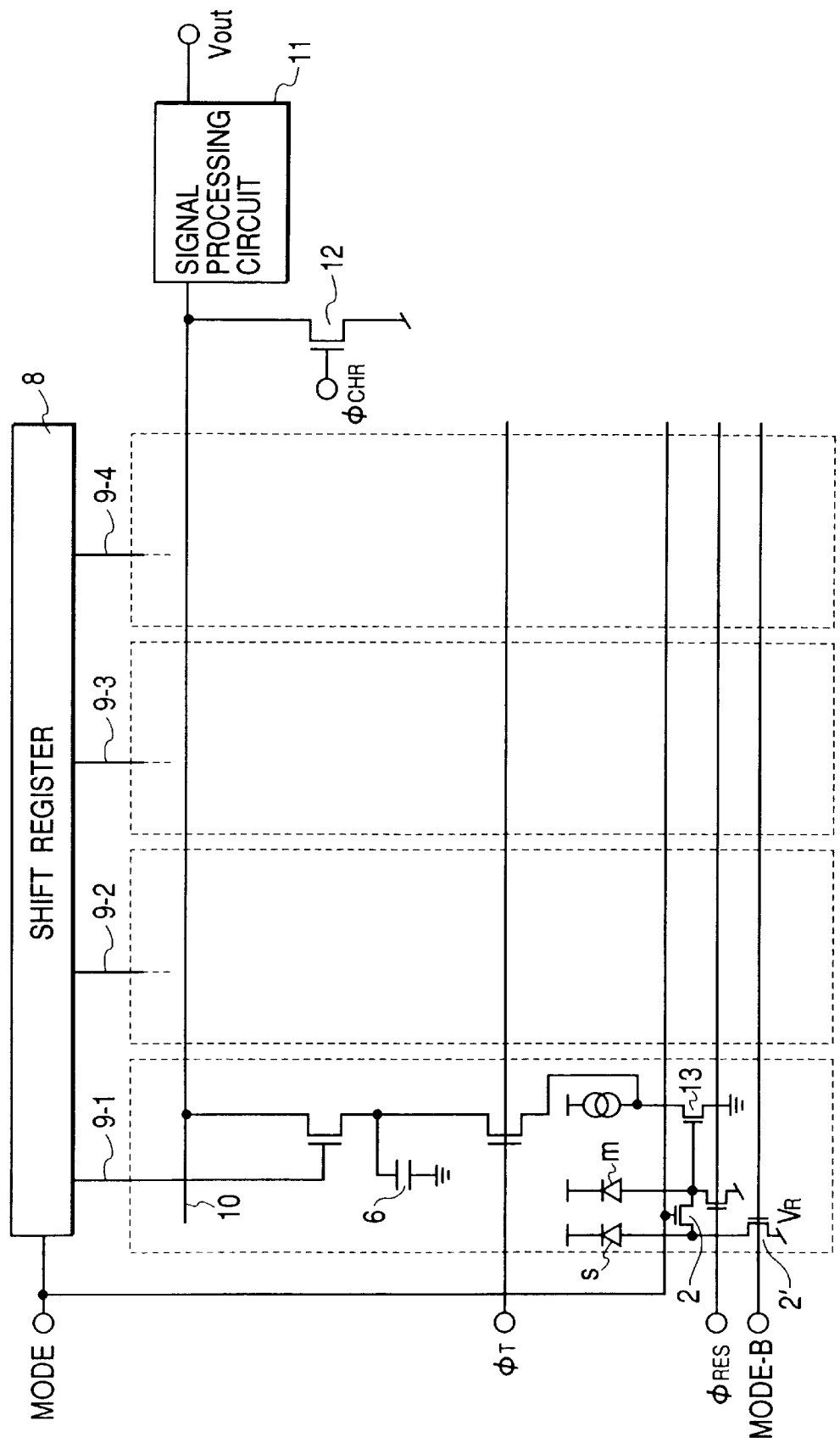
FIG. 12 is an equivalent circuit diagram (of four-pixel part) of the photoelectric conversion apparatus in the fifth embodiment of the present invention.

FIG. 10 is a schematic plan view of the photodetector part in the photoelectric conversion apparatus of the embodiment of the present invention, FIG. 11 is a structural diagram to show a cross section along a line 11—11 in FIG. 10, and FIG. 12 is an equivalent circuit diagram of photodetectors of four pixels in the photoelectric conversion apparatus. The present embodiment will be described as to the photoelectric conversion apparatus for the contact type image sensor having the resolution switching function between the high resolution of 600 dpi and the low resolution of 300 dpi.

In FIG. 10, the photoelectric conversion apparatus 1 is constructed in such structure that the high-resolution photodetectors m1, m2, . . . , mN and low-resolution photodetectors s1, s2, . . . , sN are arranged at the pitch of Xr1 in the main scanning direction and at the pitch of Yr1 in the sub-scanning direction. In the present embodiment, the resolutions are 600 dpi in the high resolution mode and 300 dpi in the low resolution mode, and thus the following relations hold.

$Xr1\ Yr1\ 42.3\ \mu m$ $Xr2\ Yr2\ 84.6\ \mu m$

The high-resolution photodetector m1, m2, . . . , or mN and the low-resolution photodetector s1, s2, . . . , or sN in each pixel are connected via the sub-scanning resolution changeover means 2-1, 2-2, . . . , or 2-N by the wire 4, and the sub-scanning resolution changeover means 2-1, 2-2, . . . , and 2-N and low-resolution photodetector potential fixing mens 2'-1, 2'-2, . . . , and 2'-N are controlled by a resolution control signal (MODE) and by an inversion (MODEB) of the resolution control signal, respectively.

Further, a light signal having undergone photoelectric conversion in each photodetector is processed by the signal processing and scanning means 3 and thereafter outputted through the output terminal (Vout).

FIG. 11 is the structural diagram to show the cross section along the line 11—11 in FIG. 10. In the present embodiment the high-resolution photodetectors m and low-resolution photodetectors s are comprised of photodiodes having the $p^+/n^-$ junction. In the present embodiment, the substantial photoelectric conversion region in each photodetector is a portion defined by the $n^+$ region 5 provided through the $n^-$ region around the $p^+$ region forming each photodiode.

The high-resolution photodetector m and low-resolution photodetector s are electrically connected to each other via the wire 4 and the NMOS transistor as the sub-scanning resolution changeover means 2. Here the wires 4 can be those made of a wire material used in the ordinary semiconductor processes, for example, one selected from wire materials containing aluminum as a matrix, low-resistance materials containing silicon as a matrix, and so on. In the present embodiment the NMOS transistors are indicated as the sub-scanning resolution changeover means 2 and the low-resolution photodetector potential fixing means 2', but these means may also be constructed in any other configuration for controlling electrical connection, for example, using PMOS transistors, analog switches, and so on.

FIG. 12 is the equivalent circuit diagram of four pixels of the photodetectors illustrated in FIG. 10 and FIG. 11. FIG. 12 presents the illustration of only an equivalent circuit of one pixel with omitting the illustration for the other pixels. The operation of the present embodiment will be described referring to FIG. 12.

In the present embodiment, the apparatus is constructed so as to be in the high resolution mode with the resolution control signal (MODE) at the low level and be in the low resolution mode with the resolution control signal (MODE) at the high level.

When the resolution control signal (MODE) is at the low level, the apparatus is in the high resolution mode in which the NMOS transistors 2 as the sub-scanning resolution changeover means are in the off state. Therefore, only the high-resolution photodetector m is a photodetector to output a light signal in each pixel. The light signal having undergone photoelectric conversion in the high-resolution photodetector m is read through the source follower 13 into the holding capacitor 6 and thereafter the high-resolution photodetector m is reset by the reset switch 7. Then storage is started again. On the other hand, the light signal read into the holding capacitor 6 is then read into the common output line 10 by the shift register 8 to be subjected to signal processing in the signal processing circuit 11, and thereafter the signal is outputted through the output terminal Vout.

In the present embodiment the shift register 8 is configured so as to sequentially scan the pixels one by one in the high resolution mode. Specifically, the shift register output line 9-1 of the first pixel is first made active, thereafter the common output line 10 is reset by the reset switch 12, and then the shift register output line 9-2 of the second pixel is made active. Such operation is repeated up to reading of the last pixel. In this case, the apparatus can implement scanning in the resolution of 600 dpi both in the main scanning direction and in the sub-scanning direction.

In this high resolution mode, the low-resolution photodetector s is in a non-selected state, while the NMOS switch 2' as the low-resolution photodetector potential fixing means is in the on state. Thus the potential of the low-resolution photodetector s is fixed at the potential of the power supply (VR) and the photocarriers having undergone photoelectric conversion in the low-resolution photodetector s flow to VR.

As a consequence, the present embodiment can suppress malfunctions of crosstalk, aliasing, etc. occurring due to flow of the photocarriers having undergone the photoelectric conversion in the low-resolution photodetector s, into the high-resolution photodetector m or into an adjacent photodetector.

Next, when the resolution control signal (MODE) is at the high level, each NMOS transistor 2 as the sub-scanning resolution changeover means is in the on state and the NMOS switch 2' as the low-resolution photodetector potential fixing means is in the off state, so that the light signals are outputted from the high-resolution photodetector m and from the low-resolution photodetector s.

The light signals having undergone the photoelectric conversion in the high-resolution photodetector m and in the low-resolution photodetector s are similarly read through the source follower 13 into the holding capacitor 6, thereafter the high-resolution photodetector m and the low-resolution photodetector s are reset by the reset switch 7, and then storage of charge is started again. On the other hand, the light signal read into the holding capacitor is then read into the common output line 10 by the shift register 8 to be subjected to signal processing in the signal processing circuit 11, and thereafter the signal is outputted through the output terminal Vout.

In the present embodiment, the shift register 8 is configured so as to sequentially scan the pixels two by two in the low resolution mode. Specifically, the shift register output line 9-1 of the first pixel and the shift register output line 9-2 of the second pixel are made active simultaneously to output a signal of the first pixel.

After that, the common output line 10 is reset by the reset switch 12, and then the shift register output line 9-3 of the third pixel and the shift register output line 9-4 of the fourth pixel are made active to output a signal of the second pixel. This operation is repeated up to reading of the last pixel. In this case, the number of read pixels is half of that in the high resolution mode and thus the apparatus can implement scanning in the resolution of 300 dpi both in the main scanning direction and in the sub-scanning direction.

In the present embodiment, since the NMOS transistors are used as the sub-scanning resolution changeover means 2 and low-resolution photodetector potential fixing means 2', the resolution control signal (MODE) is used as a control signal for the sub-scanning resolution changeover means 2, and the inversion (MODEB) of the resolution control signal (MODE) as a control signal for the low-resolution photodetector potential fixing means 2'.

When the low-resolution photodetector s is selected by the resolution control signal (MODE), the low-resolution photodetector potential fixing means 2' needs to be in the non-conductive state. When the low-resolution photodetector s is not selected, the low-resolution photodetector potential fixing means 2' needs to be in the conductive state. Therefore, where the sub-scanning resolution changeover means 2 and low-resolution photodetector potential fixing means 2' are the elements of the same kind, polarities of their control signals need to be inverse to each other.

For example, in a case wherein the sub-scanning resolution changeover means 2 are NMOS transistors and the low-resolution photodetector potential fixing means 2' are PMOS transistors, the sub-scanning resolution changeover means 2 and the low-resolution photodetector potential fixing means 2' can be controlled by the same control signal accordingly.

The present embodiment employs an optional and independent power supply as the power supply (VR) connected to the low-resolution photodetector potential fixing means 2', but the reset power supply for the high-resolution photodetectors m may be shared between them.

Now let us make comparison of the storage time of the photoelectric conversion apparatus of the present embodiment with that of the photoelectric conversion apparatus of the resolution changeover method without provision of the low-resolution photodetectors s.

In the photoelectric conversion apparatus of the present embodiment, the light output per unit charge, i.e., charge detection sensitivity R can be expressed by the following equation.

$$R = 1/CPD \times GSF \times CT/(CT+CH) \times GAMP$$

where

CPD: capacitance at the photoreceptive part

GSF: source follower gain

CT: capacitance at the holding capacitor

CH: capacitance at the common output line

GAMP: gain of the signal processing circuit part.

The light output Vp can be expressed by the following equation.

$$Vp \: L \times SPD \times ts \times R$$

where

L: quantity of incident light per unit area

SPD: area of photoreceptive part.

Therefore, where the quantity of incident light, source follower gain, and amplifier gain are constant, the storage time ts necessary for a given light output is given as follows.

$$ts \: 1/(L \times SPD \times R) \quad CPD/(SPD \times CT/(CT+CH))$$

The following table presents comparison of the capacitance at the photoreceptive part, the capacitance at the holding capacitor, the capacitance at the common output line, the area of the photoreceptive part, and the storage time necessary for obtaining the light output of 1 V in the high resolution mode with those in the low resolution mode of the present embodiment and the prior art.

TABLE 4

| | High resolution mode | Low resolution mode of the prior art | Low resolution mode of the present embodiment |
|---|---|---|---|
| capacitance at photoreceptive part CPD | 40 pF | 40 pF | 50 pF |
| capacitance at holding capacitor CT | 5 pF | 10 pF | 10 pF |
| capacitance at common output line CH | 5 pF | 5 pf | 5 pF |
| capacitance-divided gain CT/(CT + CH) | 0.50 | 0.67 | 0.67 |
| relative ratio of area of photoreceptive part | 1.0 | 1.0 | 1.9 |

TABLE 4-continued

|  | High resolution mode | Low resolution mode of the prior art | Low resolution mode of the present embodiment |
| --- | --- | --- | --- |
| storage time | 10 msec | 7.5 msec | 4.9 msec |
| relative ratio of storage time | 1.00 | 0.75 | 0.49 |

It is seen from Table 4 that with the photodetectors of the photoelectric conversion apparatus of the present embodiment the charge storage time is 0.65 times that of the prior art and thus the reading speed per line can be about 1.5 times faster and that the photodetectors of the photoelectric conversion apparatus of the present embodiment are very effective in decreasing the storage time, i.e., in increasing the reading speed.

In the present embodiment the apparatus exemplified was the photoelectric conversion apparatus used in the contact type image sensor, but the present invention can also be applied to the photoelectric conversion apparatus for demagnifying optical systems in which the pixels are arranged at the pitch of several μm to several ten μm.

The photodetectors can not be applied only to the photoelectric conversion apparatus for monochromatic images, but can also be applied to the photoelectric conversion apparatus for color images according to the light source changeover method and the photoelectric conversion apparatus for color images provided with a color filter.

Further, the present embodiment shows the example of the apparatus in which the resolution in the low resolution mode was half of that in the high resolution mode, but, for example, a configuration in which the resolution in the low resolution mode is one third of that in the high resolution mode, can also be implemented by modifying the size of the low-resolution photodetectors s in the sub-scanning direction. It is also noted that the resolution switching is not limited to the two types of resolutions, but the present invention can also be applied to the resolution switching of three types of resolutions, for example.

Embodiment 6 will be Described Below.

Figure 13:
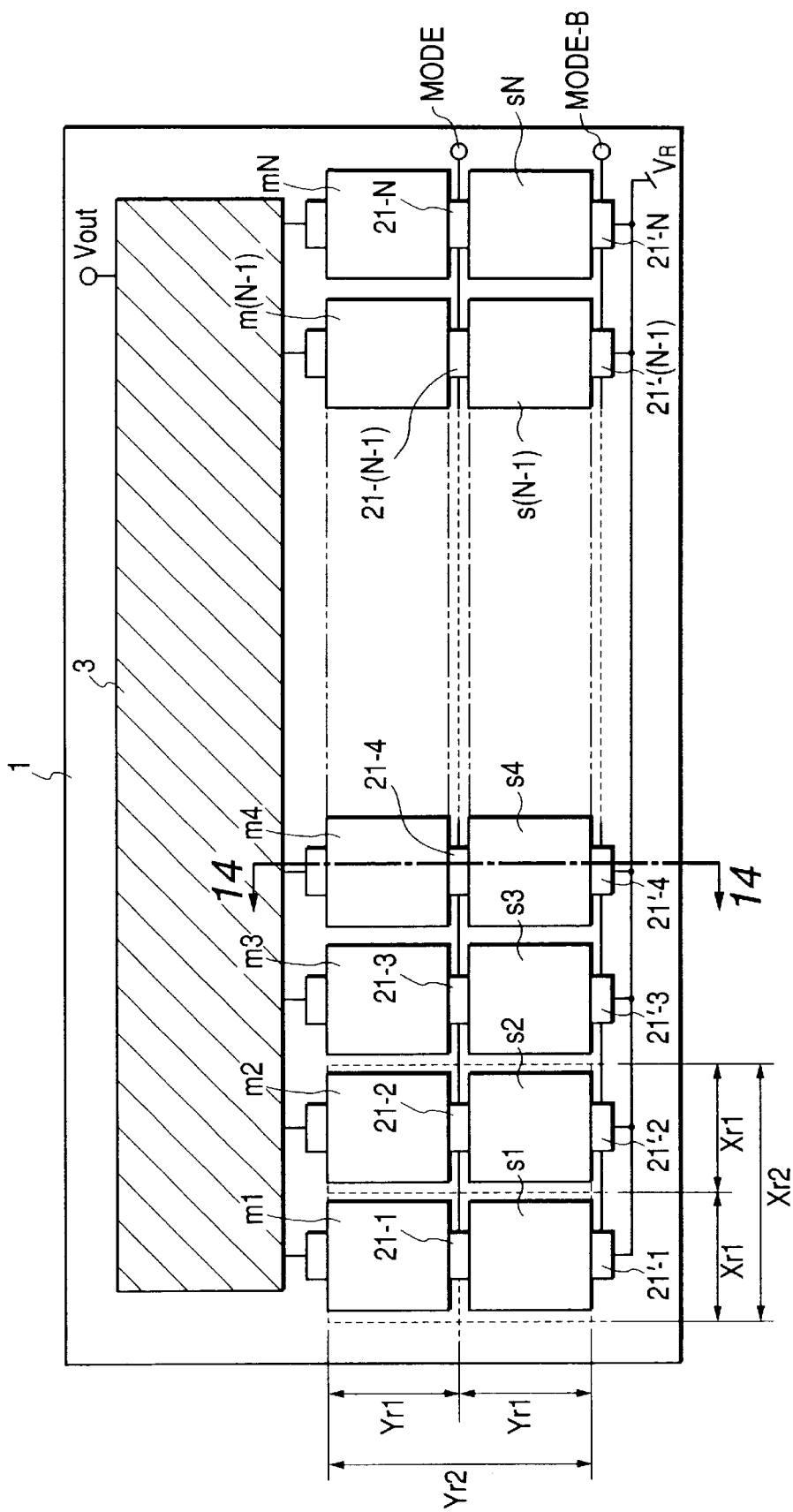
FIG. 13 is a schematic plan view of photodetector part of the photoelectric conversion apparatus in the sixth embodiment of the present invention.
Figure 14:
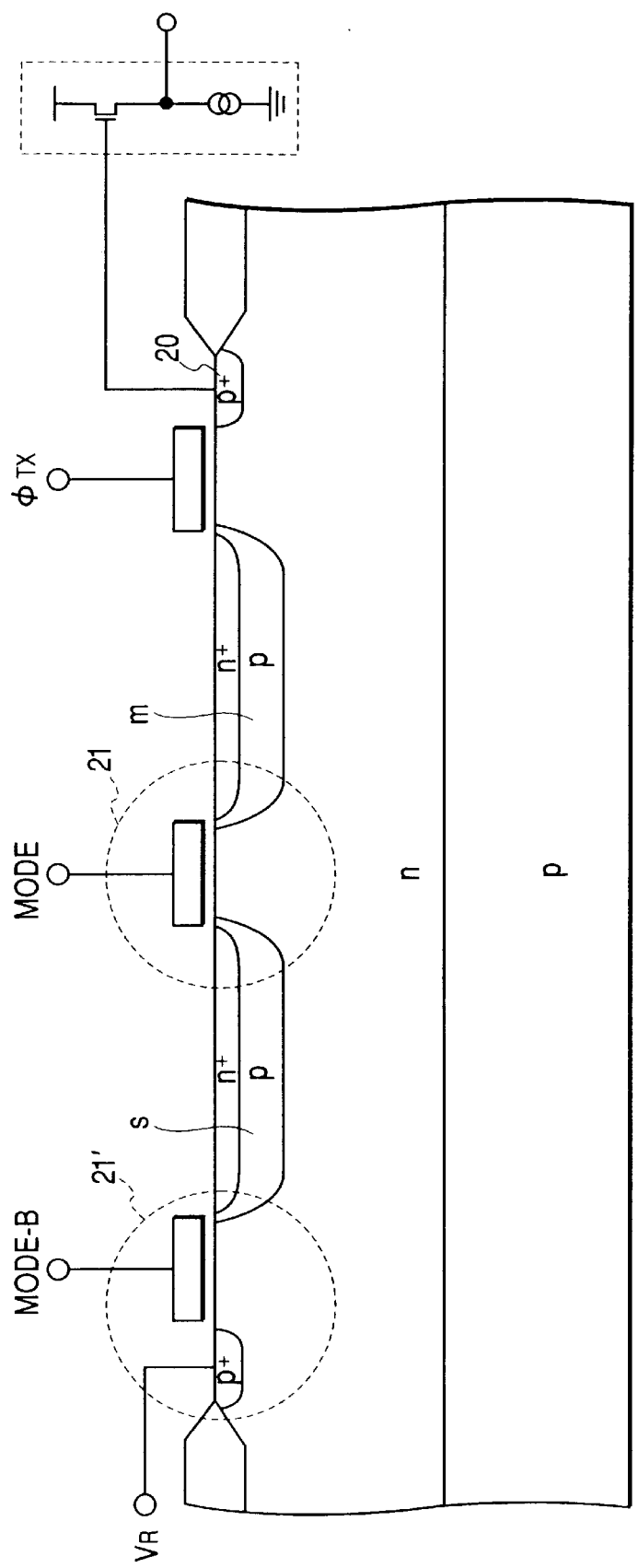
FIG. 14 is a structural diagram to show a cross section along a line 14—14 in FIG. 13.
Figure 15:
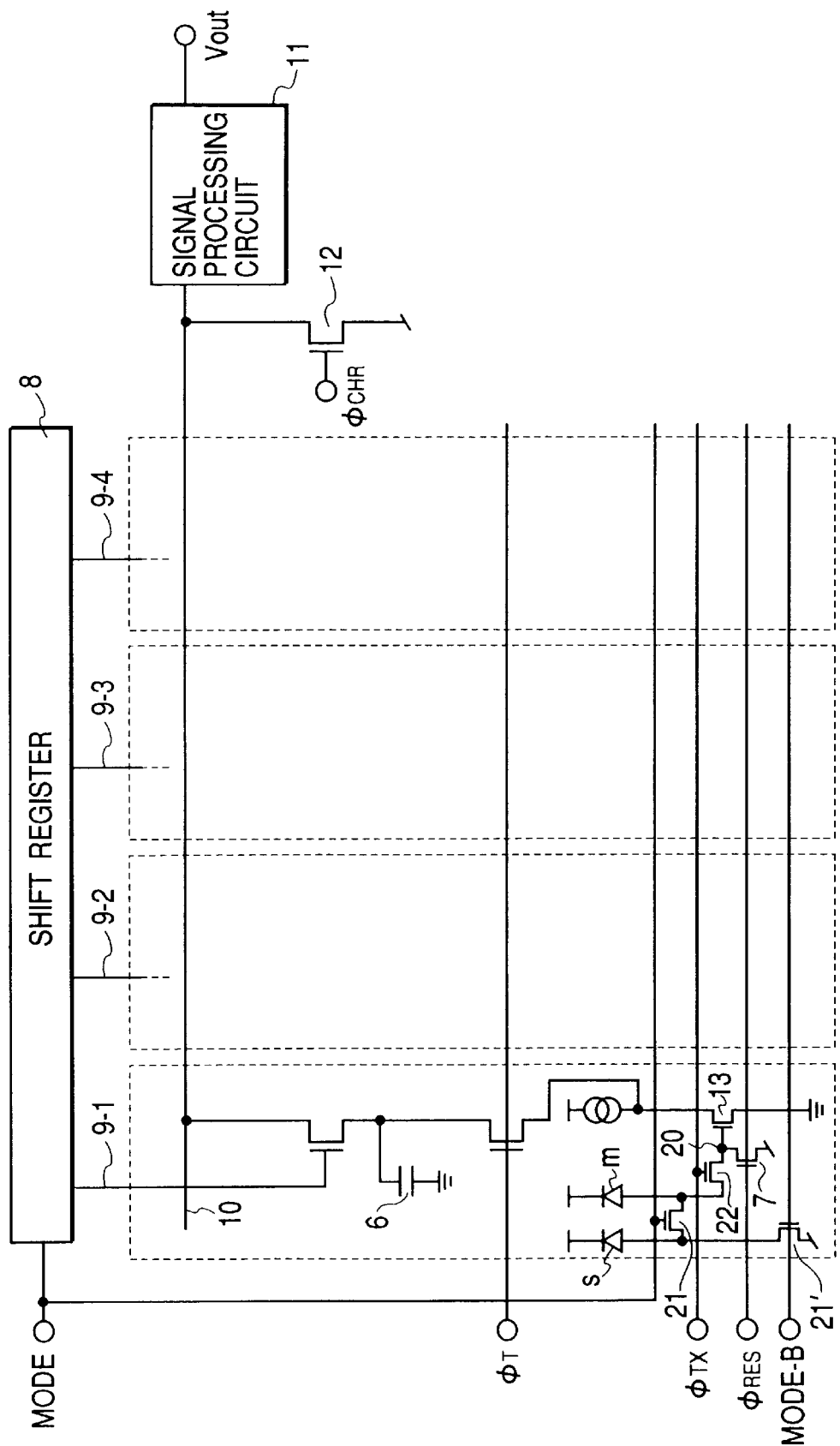
FIG. 15 is an equivalent circuit diagram (of four-pixel part) of the photoelectric conversion apparatus in the sixth embodiment of the present invention.

FIG. 13 is a schematic plan view of the photodetector part in the photoelectric conversion apparatus of the embodiment of the present invention, FIG. 14 is a structural diagram to show a cross section along a line 14—14 in FIG. 13, and FIG. 15 is an equivalent circuit diagram of photodetectors of four pixels in the photoelectric conversion apparatus. The present embodiment will be described as to the photoelectric conversion apparatus for the contact type image sensor having the resolution switching function between the high resolution of 1200 dpi and the low resolution of 600 dpi.

In FIG. 13, the photoelectric conversion apparatus 1 is constructed in such structure that the high-resolution photodetectors m1, m2, . . . , mN and low-resolution photodetectors s1, s2, . . . , sN are arranged at the pitch of Xr1 in the main scanning direction and at the pitch of Yr1 in the sub-scanning direction. In the present embodiment, the resolutions are 1200 dpi in the high resolution mode and 600 dpi in the low resolution mode, and thus the following relations hold.

Xr1 Yr1 21.2 μm

Xr2 Yr2 42.3 μm

The high-resolution photodetector m1, m2, . . . , or mN and the low-resolution photodetector s1, s2, . . . , or sN in each pixel are connected via a sub-scanning resolution changeover means 21-1, 21-2, . . . , or 21-N and the sub-scanning resolution changeover means 21-1, 21-2, . . . , and 21-N are controlled by the resolution control signal (MODE).

Further, each of the low-resolution photodetectors s1, s2, . . . , and sN is connected through the low-resolution photodetector potential fixing means 21-1, 21-2, . . . , or 21-N to the power supply (VR) and the low-resolution photodetector potential fixing means 21-1, 21-2, . . . , and 21-N are controlled by the inversion (MODEB) of the resolution control signal (MODE).

A light signal having undergone photoelectric conversion in each photodetector is processed by the signal processing and scanning means 3 and thereafter outputted through the output terminal (Vout).

FIG. 14 is the structural diagram to show the cross section along the line 14—14 in FIG. 13. In the present embodiment each photodetector is comprised of a photodiode having the $n^+/p/n$ junction. In the present embodiment, the substantial photoelectric conversion region is a portion defined by the p region forming each photodiode. In the present embodiment signal carriers having undergone photoelectric conversion in each photodiode are transferred to the $p^+$ region as a floating diffusion region 20.

The high-resolution photodetector m and the low-resolution photodetector s are electrically connected to each other through the sub-scanning resolution control means (transfer switch) 21. With MODE at the high level, the transfer switch 21 is off, and thus photocarriers of only the high-resolution photodetector m are transferred to the floating diffusion region 20 by a read pulse (ΦTX).

With MODE at the low level, the transfer switch 21 is switched into the on state, photocarriers having undergone photoelectric conversion in the high-resolution photodetector m and in the low-resolution photodetector s are transferred to the floating diffusion region 20 by a read pulse (ΦTX).

FIG. 15 is the equivalent circuit diagram of a four-pixel portion of FIG. 13 and FIG. 14. FIG. 15 presents the illustration of only an equivalent circuit of one pixel with omitting the illustration for the other pixels. The operation of the present embodiment will be described referring to FIG. 15.

In the present embodiment, the apparatus is constructed so as to be in the high resolution mode with the resolution control signal (MODE) at the high level and be in the low resolution mode with the resolution control signal (MODE) at the low level.

When the resolution control switch (MODE) is at the high level, each transfer switch 21 as the sub-scanning resolution changeover means is in the off state, and thus only the high-resolution photodetector m is a photodetector to output a light signal in each pixel. The photocarriers having undergone photoelectric conversion in the high-resolution photodetector m are transferred through the transfer switch 22 to the floating diffusion region 20.

Then the photocarriers are subjected to charge-voltage conversion in the source follower 13 and thereafter the signal is read into the holding capacitor 6. After that, the floating diffusion region 20 is reset by the reset switch 7 and then storage is started again. On the other hand, the signal read into the holding capacitor is then read into the common output line by the shift register 8 to be subjected to signal processing in the signal processing circuit 11, and thereafter the signal is outputted through the output terminal Vout.

At this time, because the PMOS switch 21' is on, the photocarriers having undergone photoelectric conversion in the low-resolution photodetector s flow through the PMOS switch 21' to the power supply (VR). Therefore, the photo-carriers produced in the low-resolution photodetector s can be prevented from mixing into the other photodetectors.

In the present embodiment the shift register 8 is configured so as to sequentially scan the pixels one by one in the high resolution mode. Specifically, the shift register output line 9-1 of the first pixel is first made active, thereafter the common output line 10 is reset by the reset switch 12, and then the shift register output line 9-2 of the second pixel is made active. Such operation is repeated up to reading of the last pixel. In this case, the apparatus can implement scanning in the resolution of 1200 dpi both in the main scanning direction and in the sub-scanning direction.

Next, when the resolution control signal (MODE) is at the low level, the transfer switch 21 as the sub-scanning resolution changeover means is in the on state and the PMOS switch 21' is in the off state, so that the light signals are outputted from the high-resolution photodetector m and from the low-resolution photodetector s. The photocarriers having undergone the photoelectric conversion in the high-resolution photodetector m and in the low-resolution photodetector s are similarly read through the source follower 13 into the holding capacitor 6.

After that, the floating diffusion region 20 is reset by the reset switch 7, and then storage of charge is started again. On the other hand, the light signal read into the holding capacitor 6 is then read into the common output line 10 by the shift register 8 to be subjected to signal processing in the signal processing circuit 11, and thereafter the signal is outputted through the output terminal Vout.

In the present embodiment, the shift register 8 is configured so as to sequentially scan the pixels two by two in the low resolution mode. Specifically, the shift register output line 9-1 of the first pixel and the shift register output line 9-2 of the second pixel are made active simultaneously to output a signal of the first pixel. After that, the common output line 10 is reset by the reset switch 12, and then the shift register output line 9-3 of the third pixel and the shift register output line 9-4 of the fourth pixel are made active to output a signal of the second pixel.

This operation is repeated up to reading of the last pixel. In this case, the number of read pixels is half of that in the high resolution mode and thus the apparatus can implement scanning in the resolution of 600 dpi both in the main scanning direction and in the sub-scanning direction.

Now let us make comparison of the charge storage time of the photoelectric conversion apparatus of the present embodiment with that of the photoelectric conversion apparatus of the resolution changeover method without provision of the low-resolution photodetectors s. In the photoelectric conversion apparatus of the present embodiment, the light output per unit charge, i.e., charge detection sensitivity R can be expressed by the following equation.

$$R=1/CFD \times GSF \times CT/(CT \times CH) \times GAMP$$

where
CFD: capacitance at the floating diffusion part
GSF: source follower gain
CT: capacitance at the holding capacitor
CH: capacitance at the common output line
GAMP: gain of the signal processing circuit part.

The light output Vp can be expressed by the following equation.

$$Vp \, L \times SPD \times ts \times R$$

where
L: quantity of incident light per unit area
SPD: area of photoreceptive part.

Therefore, where the quantity of incident light, source follower gain, and amplifier gain are constant, the storage time ts necessary for a given light output is given as follows.

$$ts \, 1/(L \times SPD \times R) \; CFD/(SPD \times CT/(CT+CH))$$

The following table presents comparison of the capacitance at the photoreceptive part, the capacitance at the holding capacitor, the capacitance at the common output line, the area of the photoreceptive part, and the storage time necessary for obtaining the light output of 1 V in the high resolution mode with those in the low resolution mode of the present embodiment and the prior art.

TABLE 5

|  | High resolution mode | Low resolution mode of the prior art | Low resolution mode of the present embodiment |
| --- | --- | --- | --- |
| capacitance at FD part CFD | 20 pF | 20 pF | 20 pF |
| capacitance at holding capacitor CT | 10 pF | 20 pF | 20 pF |
| capacitance at common output line CH | 8 pF | 8 pF | 8 pF |
| capacitance-divided gain CT/(CT + CH) | 0.56 | 0.71 | 0.71 |
| relative ratio of area of photoreceptive part | 1.0 | 1.0 | 2.0 |
| storage time | 10 msec | 7.9 msec | 3.9 msec |
| relative ratio of storage time | 1.00 | 0.79 | 0.39 |

It is seen from Table 5 that with the photodetectors of the photoelectric conversion apparatus of the present embodiment the charge storage time is 0.49 times that of the prior art and thus the reading speed per line can be about 2 times faster and that the present embodiment is very effective in decreasing the storage time, i.e., in increasing the reading speed.

Embodiment 7 will be Described Below.

Figure 16:
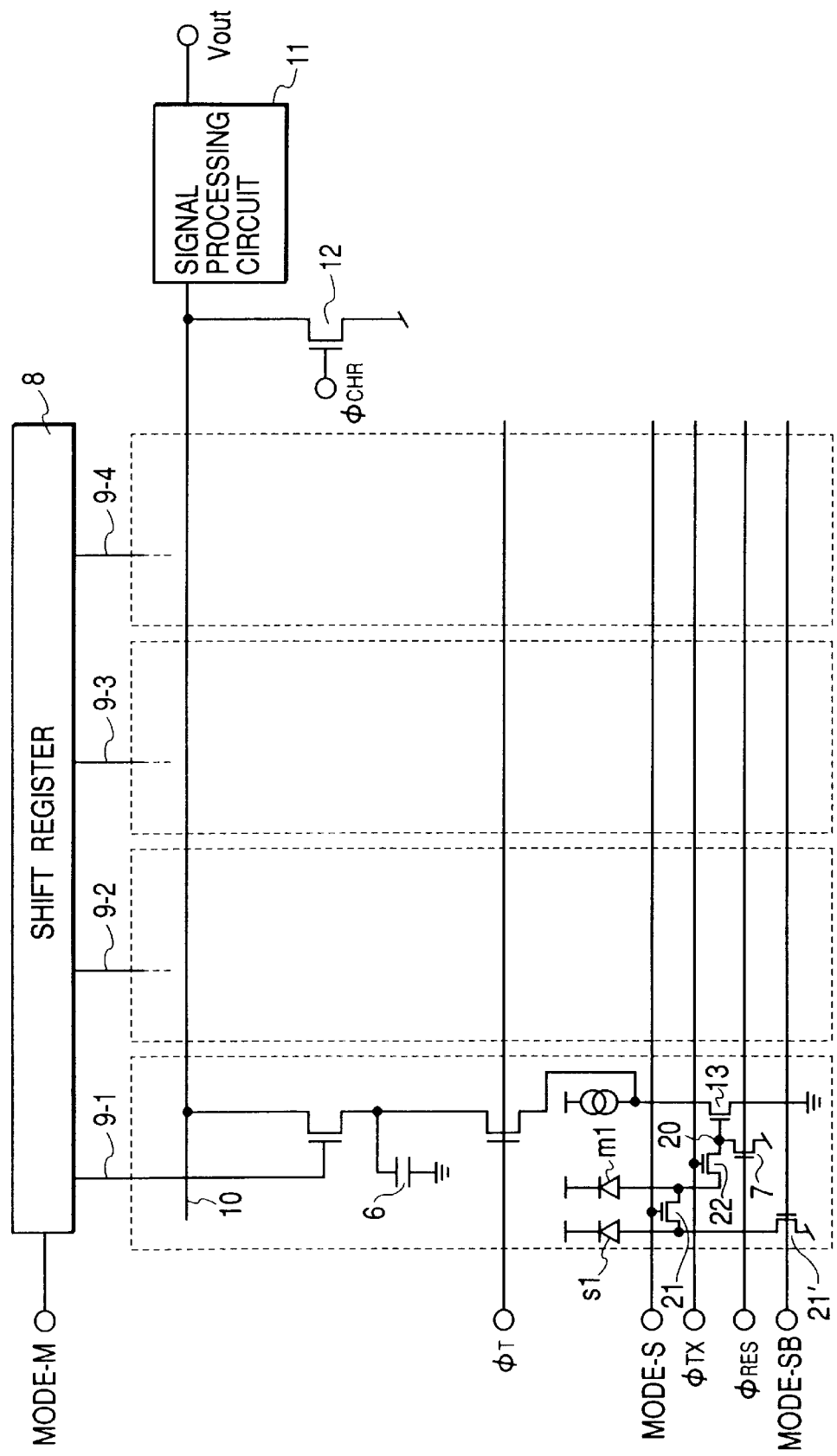
FIG. 16 is an equivalent circuit diagram (of four-pixel part) of the photoelectric conversion apparatus in the seventh embodiment of the present invention.

FIG. 16 is an equivalent circuit diagram of the photodetectors of four pixels in the photoelectric conversion apparatus of the present embodiment. The present embodiment is the photoelectric conversion apparatus with the resolution changeover function permitting optional switching between resolutions in the main scanning direction and in the sub-scanning direction. FIG. 16 is the equivalent circuit diagram to show four pixels in the present embodiment, and it is noted that FIG. 16 presents the illustration of only the equivalent circuit of one pixel with omitting the illustration for the other pixels.

The operation of the present embodiment will be described below referring to FIG. 16.

In the present embodiment, the apparatus is provided with the main scan resolution control signal terminal (MODE_M) and the sub-scan resolution control signal terminal (MODE_S) and the resolutions in the main scanning direction and in the sub-scanning direction can be controlled independently of each other by combinations of levels of the terminals.

In the present embodiment, the apparatus is constructed so that each of the main scanning direction and the sub-scanning direction is in the high resolution mode when the corresponding resolution control signal is at the high level, and so that each direction is in the low resolution mode when the corresponding signal is at the low level. In this case, the control signal for the PMOS switches 21' as the low-resolution photodetector potential fixing means is the inversion (MODE_SB) of the sub-scanning resolution control signal (MODE_S).

The present embodiment is similar to Embodiment 7 except that the resolution control signals are provided independently of each other for the main scanning direction and for the sub-scanning direction and that the resolutions are 600 dpi in the high resolution mode and 300 dpi in the low resolution mode.

The following table presents a comparison example of the relation between resolution control signals and resolutions, and the reading speed per line in the present embodiment.

TABLE 6

| Main scan resolution control signal (MODE_M) | sub-scan resolution control signal (MODE_S) | main scan resolution | sub-scan resolution | read speed (msec) | |
|---|---|---|---|---|---|
| | | | | present embodiment | prior art |
| H | H | 600 dpi | 600 dpi | 5.0 | 5.0 |
| H | L | 600 dpi | 300 dpi | 2.5 | 5.0 |
| L | H | 300 dpi | 600 dpi | 4.0 | 4.0 |
| L | L | 300 dpi | 300 dpi | 2.0 | 4.0 |

As seen from Table 6, the photoelectric conversion apparatus of the present embodiment is constructed so as to permit optional switching between the resolutions in the main scanning direction and in the sub-scanning direction. Further, it can accomplish the higher reading speed, particularly, in the low resolution mode along the sub-scanning direction, as compared with the prior art.

Embodiment 8 will be Described Below.

Figure 17:
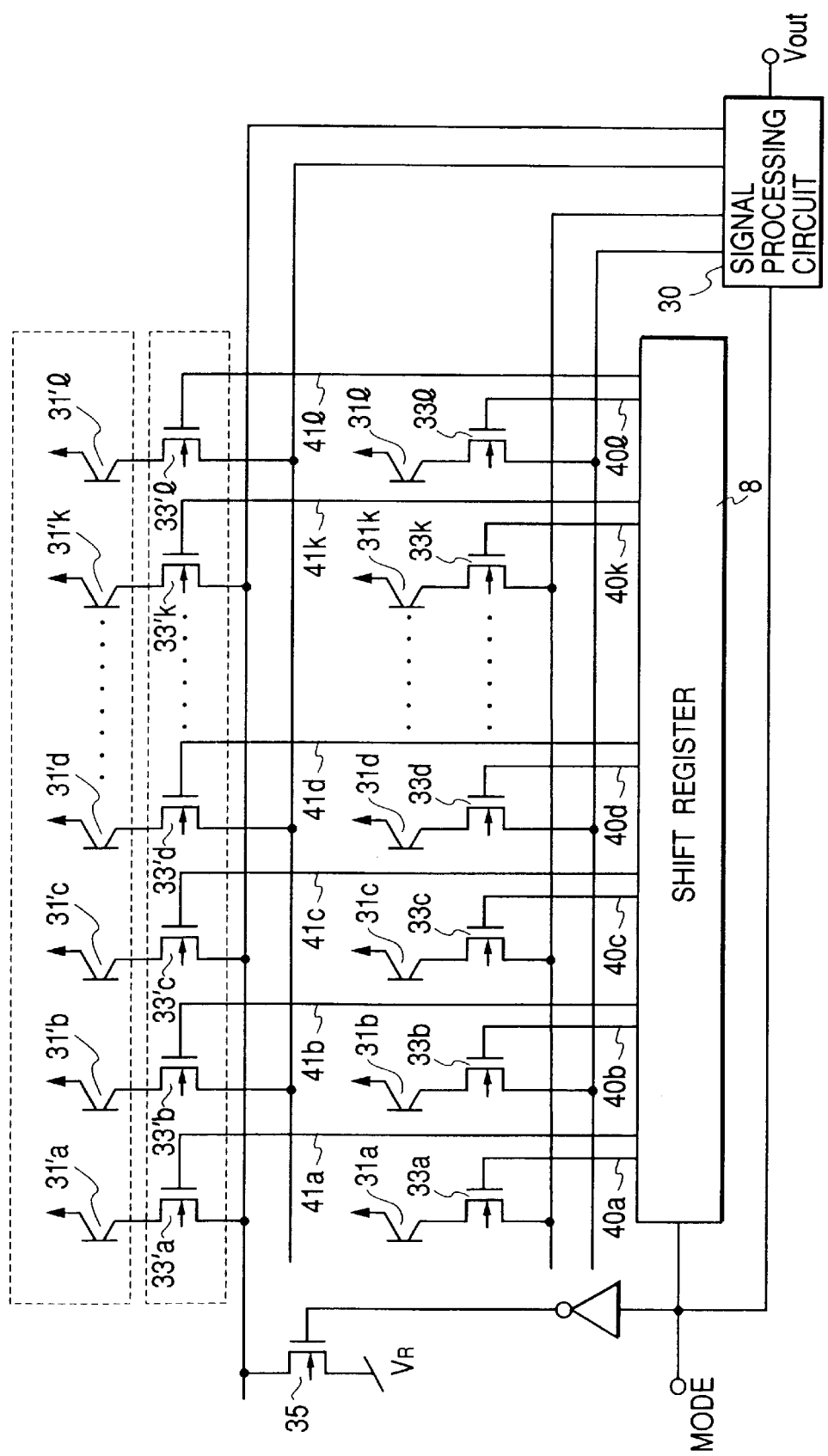
FIG. 17 is an equivalent circuit diagram of the photoelectric conversion apparatus in the eighth embodiment of the present invention.

FIG. 17 is an equivalent circuit diagram of the photoelectric conversion apparatus of the present embodiment. The present embodiment illustrates the photoelectric conversion apparatus of the current read type using phototransistors as the photodetectors.

In the present embodiment the photodetectors are high-resolution phototransistors 31a to 31l and low-resolution phototransistors 31'a to 31'l. Here each group of the phototransistors 31a to 31l and the phototransistors 31'a to 31'l are arranged in the resolution of 300 dpi in the main scanning direction and in the sub-scanning direction. In the present embodiment, therefore, the resolutions in the main scanning direction and in the sub-scanning direction are 300 dpi in the high resolution mode and 150 dpi in the low resolution mode.

Each of the high-resolution phototransistors 31a to 31l and the low-resolution phototransistors 31'a to 31'l is provided with the read switch 33a to 33l, 33'a to 33'l, and they are successively activated by the shift register 8 to sequentially read photocurrents of the high-resolution phototransistors 31a to 31l and the low-resolution phototransistors 31'a to 31'l.

The shift register 8 is controlled by the resolution changeover control signal (MODE), and in the low resolution mode the high-resolution phototransistor and the low-resolution phototransistor both are read simultaneously in each pixel, together with adjacent pixels.

In the high resolution mode high-resolution shift register output lines 40a to 40l are successively made active to sequentially read outputs from the high-resolution phototransistors 31a to 31l. However, high-resolution shift register output lines 41a to 41l for driving the low-resolution phototransistors 31'a to 31'l are always in the on state and the NMOS switches 35 as the low-resolution phototransistor fixing means are also in the on state in the high resolution mode. Therefore, the photocurrents of the low-resolution phototransistors 31'a to 31'l flow to the power supply (VR), so that the output lines thereof are fixed at the potential of the power supply (VR).

As a consequence, the light signals generated in the low-resolution phototransistors 31'a to 31'l in the high resolution mode can be prevented from affecting the outputs of the high-resolution phototransistors 31a to 31l.

A light signal read out of each phototransistor is subjected to current-voltage conversion in the signal processing circuit 30 to be outputted through the output terminal (VOUT). The resolution control signal (MODE) is also supplied to the signal processing circuit 30 and the signal processing circuit 30 performs the addition process of the photocurrents read out of the high-resolution phototransistors 31a to 31l and the low-resolution phototransistors 31'a to 31'l according to the resolution.

In the present embodiment the photoreceptive area in the low resolution mode can be four times that in the high resolution mode. Therefore, the reading speed in the low resolution mode of the present embodiment can be double that in a case in which the output involves addition of only an adjacent pixel, without provision of the low-resolution phototransistors 31'a to 31'l.

As described above, the present embodiment exhibits its effect when applied not only to the photoelectric conversion apparatus of the batch reading method, but also to the photoelectric conversion apparatus of the sequential reading method.

Embodiment 9 will be Described Below.

Figure 18:
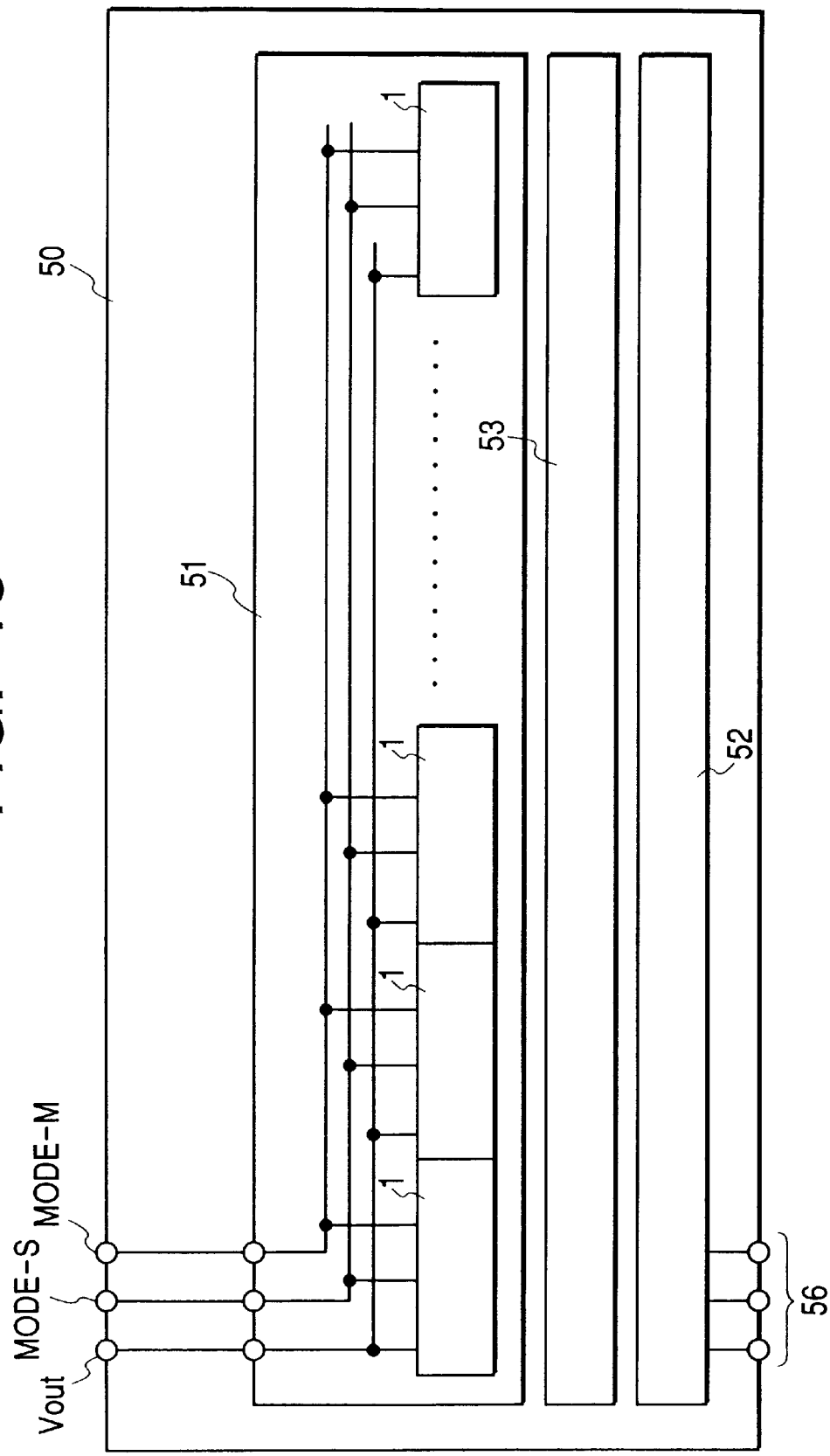
FIG. 18 is a block diagram of a contact type image sensor unit in the ninth embodiment of the present invention.
Figure 19:
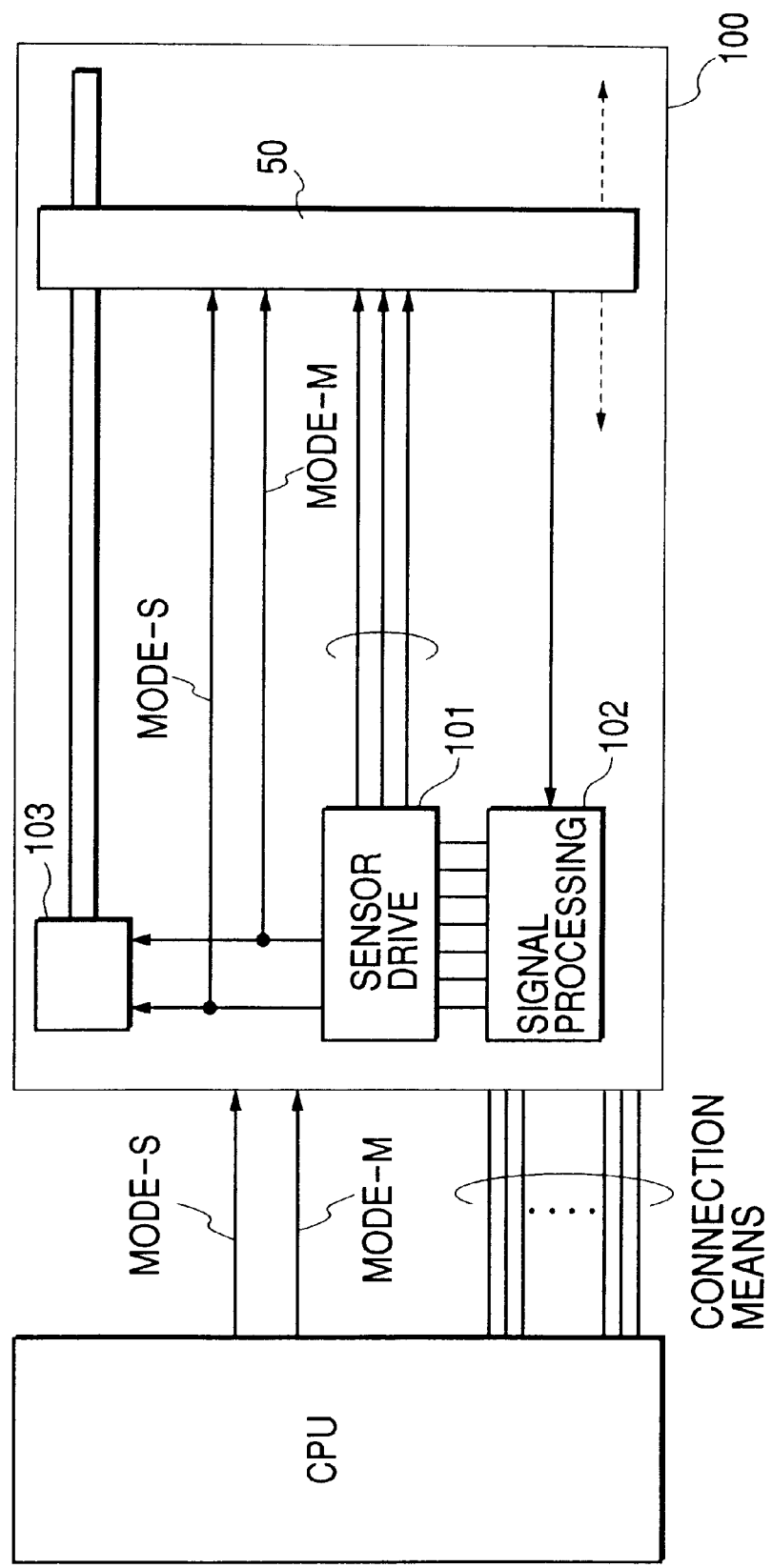
FIG. 19 is a block diagram of an image input system in the ninth embodiment of the present invention.

FIG. 18 is a block diagram of a contact type image sensor unit in the present embodiment and FIG. 19 is a block diagram of an image input system incorporating the contact type image sensor unit of FIG. 18. The present embodiment is an example in which the contact type image sensor unit is constructed using the photoelectric conversion apparatus of Embodiments 4 and 8 and in which this contact type image sensor unit is applied to the image reading system.

The contact type image sensor unit 50 has a sensor module substrate 51, a light source 52, and an imaging section 53. In the present embodiment the light source 52 is composed of LEDs and a lightguide member for guiding light from the LEDs to an original surface to illuminate the original surface uniformly. However, the light source may be one constructed of a plurality of LED chips mounted in a one-dimensional array, or a light source such as a cold-cathode tube or the like.

In the present embodiment the imaging section 53 is a lens array the principal material of which is glass, but it may also be an optical component made of another material. The sensor module substrate 51 in the present embodiment has the structure in which a plurality of the photoelectric conversion devices 1 of the present invention described in Embodiment 8 are mounted in the one-dimensional array on a ceramic substrate.

Further, the output terminal (VOUT), the main-scan resolution control signal terminal (MODE_M), and the sub-scan resolution control signal terminal (MODE_S) are connected to all the photoelectric conversion devices on the sensor module substrate 51 so as to be common to them. The photoelectric conversion devices 1 do not always have to be limited to that of Embodiment 8, but the other photoelectric conversion apparatus may also be applied thereto. Further, the contact type image sensor unit 50 is provided with source driving terminals 56 for driving/controlling the light source means.

FIG. 19 is an example of the image input system using the contact type image sensor unit 50 illustrated in FIG. 18. The image input system 100 of the present embodiment is equipped with a sensor driving circuit 101 for electrically driving the photoelectric conversion devices and light source in the contact type image sensor unit, a signal processing circuit 102 for carrying out signal processing of signals outputted from the contact type image sensor unit, and a sensor position control circuit 103 for controlling movement in the sub-scanning direction of the contact type image sensor unit.

Further, the system is configured so as to control the operation of the image input system by a CPU. The CPU outputs the main scan resolution control signal (MODE_M) and sub-scan resolution control signal (MODE_S), these signals are entered into the image input system, and they are supplied to the sensor driving circuit 101 and to the sensor position control circuit 103 in the image input system.

The operation of the present embodiment will be described below.

The CPU sets and outputs each of the external resolution control signals in the high resolution mode (600 dpi) at their high level or in the low resolution mode (300 dpi) at their low level. Suppose the number of pixels in one line of the contact type image sensor unit 50 is 5000. When the resolutions in the main scanning direction and in the sub-scanning direction both are of the high resolution mode, after completion of reading of signals of 5000 pixels along a certain line, the sensor position control circuit 103 moves the contact type image sensor unit 50 by the distance corresponding to 600 dpi, i.e., by about 42.3 $\mu$m in the sub-scanning direction and then information of the next line is read. This operation is carried out repeatedly to read image information of a desired document in the main scan resolution of 600 dpi and in the sub-scan resolution of 600 dpi.

For reading the image information in the high resolution mode in the main scanning direction and in the low resolution mode in the sub-scanning direction, after completion of reading of signals of 5000 pixels along a certain line, the sensor position control circuit 103 moves the contact type image sensor unit by the distance corresponding to 300 dpi, i.e., by about 84.6 $\mu$m in the sub-scanning direction and then information of the next line is read. This operation is carried out repeatedly to read image information of the desired document in the main scan resolution of 600 dpi and in the sub-scan resolution of 300 dpi.

In the present embodiment the sensor position control circuit 103 can be constructed, for example, of a combination of mechanical components such as a stepping motor, a shaft, a belt, and so on. The present embodiment shows the example of scanning in which the document is fixed while the image sensor is moved in the sub-scanning direction, but the present invention can also be applied to image reading systems of a method for fixing the image sensor and moving the document in the sub-scanning direction, which is so called a sheet feed method.

As described above, the image reading system of the present embodiment is arranged to be able to read the image information in any resolution efficiently by the optimum control of movement in the main scanning direction and in the sub-scanning direction of the image sensor.

As detailed above, Embodiments 1 to 9 permit the optional setting of the resolutions in the main scanning direction and in the sub-scanning direction and attain the higher reading speed in the low resolution mode.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image processing apparatus comprising:
   a photoelectric conversion area including a first light-receiving element array comprising a first plurality of light-receiving elements arranged in a main scanning direction, and a second light-receiving element array comprising a second plurality of light receiving elements arranged in the main scanning direction, said first and second light-receiving element arrays being arranged adjacent to each other in a sub-scanning direction; and
   a signal processing circuit adapted to effect a first resolution mode and a second resolution mode having a resolution lower than that of the first resolution mode, and to generate first and second resolution signals, wherein, in the first resolution mode, said signal processing circuit generates the first resolution signal from signals only from the first plurality of light-receiving elements, and in the second resolution mode, said signal processing circuit generates the second resolution signal from a sum of signals from the first and second plurality of light-receiving elements.

2. An apparatus according to claim 1, further comprising:
   a connection switch adapted to connect the first and second plurality of light-receiving elements; and
   a drive circuit adapted to turn off said connection switch when said signal processing circuit effects the first resolution mode, and to turn on said connection switch when said signal processing circuit effects the second resolution mode.

3. An apparatus according to claim 1, further comprising:
   a fixing switch adapted to fix a voltage of the second plurality of light-receiving elements to a predetermined voltage when said fixing switch is on; and
   a drive circuit adapted to turn on said fixing switch when said signal processing circuit effects the first resolution mode, and to turn off said fixing switch when said signal processing circuit effects the second resolution mode.

4. An apparatus according to claim 2, further comprising:
   a fixing switch adapted to fix a voltage of the second plurality of light-receiving elements to a predetermined voltage,
   wherein said drive circuit turns on said fixing switch when said signal processing circuit effects the first resolution mode, and turns off said fixing switch when said signal processing circuit effects the second resolution mode.

5. An apparatus according to claim 1, further comprising:
   a light source adapted to irradiate light; and
   a light guide member adapted to guide light to said photoelectric conversion area.

6. An image processing apparatus comprising:
   a photoelectric conversion area including a first light-receiving element array comprising a first plurality of light-receiving elements arranged in a main scanning direction, and a second light-receiving element
comprising a second plurality of light-receiving elements arranged in the main scanning direction, the first and second light-receiving element arrays being arranged adjacent to each other in a sub-scanning direction;

a common output unit adapted to sequentially output signals from the first and second plurality of light-receiving elements included in said photoelectric conversion area; and a first drive circuit adapted to read out the signals from said common output unit in a first resolution mode and in a second resolution mode having a resolution lower than that of the first resolution mode, wherein, in the first resolution mode, said first drive circuit generates the first resolution signals from signals only from the first plurality of light-receiving elements, and in the second resolution mode, said first drive circuit generates the second resolution signals from a sum of the signals from the first and second plurality of light-receiving elements.

7. An apparatus according to claim 6, further comprising:

a connection switch adapted to connect the first and second plurality of light-receiving elements; and a second drive circuit adapted to turn off said connection switch in the first resolution mode and turn on said connection switch when said common output unit is in the second resolution mode.

8. Apparatus according to claim 6, further comprising:

a fixing switch adapted to fix a voltage of the second plurality of light-receiving elements to a predetermined voltage; and a second drive circuit adapted to turn on said fixing switch when said common output unit is in the first resolution mode, and to turn off said fixing switch when said common output unit is in the second resolution mode.

9. An apparatus according to claim 7, further comprising:

a fixing switch adapted to fix a voltage of the second plurality of light-receiving elements to a predetermined voltage, wherein said second drive circuit turns on said fixing switch when said common output unit is in the first resolution mode, and turns off said fixing switch when the common output unit is in the second resolution mode.

10. An apparatus according to claim 6, further comprising:

a light source adapted to irradiate light; and a light guide member adapted to guide light to said photoelectric conversion area.

* * * * *

UNITED STATES PATENT AND TRADEMARK OFFICE
CERTIFICATE OF CORRECTION

PATENT NO.    : 6,531,690 B2
DATED         : March 11, 2003
INVENTOR(S)   : Hiraku Kozuka It is certified that error appears in the above-identified patent and that said Letters Patent is hereby corrected as shown below:

Column 2,
Line 24, "accomplish" should read -- address --;
Line 25, "aspect" should read -- an aspect --;
Lines 54 and 63, "photodetector" should read -- the photodetector --.

Column 3,
Lines 1, 4, 15, 24 and 27, "four-" should read -- a four- --;
Lines 10 and 19, "photodetector" should read -- the photodetector --;
Formula, "Xr1 Yr1 42.3 μm    should read -- Xr1 $\simeq$ Yr1 $\simeq$ 42.3 μm
         Xr2 Yr2 84.6 μm"                Xr2 $\simeq$ Yr2 $\simeq$ 84.6 μm --.

Column 4,
Line 38, "with" should read -- while --.

Column 5,
Second equation, "VpxLxSPDxtsxR" should read -- Vp$\propto$LxSPDxtsxR --; and
Line 64, "ts 1/(LxSPDxR) CPD/(SPDxCT/(CT+CH))" should read
-- ts $\propto$1/(LxSPDxR)$\propto$CPD/(SPDxCT/(CT+CH)) --.

Column 6,
Table 1, "5 pf" should read -- 5 pF --; and
Line 47, "can not" should read -- cannot --.

Column 7,
Formula, "Xr1 Yr1 21.2 μm    should read -- Xr1 $\simeq$ Yr1 $\simeq$ 21.2 μm
         Xr2 Yr2 42.3 μm"                Xr2 $\simeq$ Yr2 $\simeq$ 42.3 μm --;
Line 43, "pa" should read -- p$^+$ --; and
Line 61, "with" should read -- while --.

Column 9,
Second equation, "VpLxSPDxtsxR" should read -- Vp$\propto$LxSPDxtsxR --; and
Line 25, "ts 1/(LxSPDxR) CFD/(SPDxCT/(CT+CH))" should read
-- ts$\propto$1/(LxSPDxR)$\propto$CFD/(SPDxCT/(CT+CH)) --.

UNITED STATES PATENT AND TRADEMARK OFFICE
CERTIFICATE OF CORRECTION

PATENT NO. : 6,531,690 B2
DATED : March 11, 2003
INVENTOR(S) : Hiraku Kozuka

It is certified that error appears in the above-identified patent and that said Letters Patent is hereby corrected as shown below:

Column 10,
Line 18, "the both" should read -- both the --;
Line 21, "the both" should read -- both --;
Line 59, "31'a" should read -- 31a --; and
Line 61, "31'a" (first occurrence) should read -- 31a --.

Column 11,
Line 1, "311" should read -- 31$l$ --;
Line 3, "331" should read -- 33$l$ --;
Formula, "Xr1 Yr1 42.3 μm    should read -- Xr1 $\simeq$ Yr1 $\simeq$ 42.3 μm Xr2 Yr2 84.6 μm"                    Xr2 $\simeq$ Yr2 $\simeq$ 84.6 μm --; and Line 63, "mens" should read -- means --.

Column 12,
Line 28, "with" should read -- while --.

Column 14,
Second equation, "VpLxSPDxtsxR" should read -- Vp$\propto$LxSPDxtsxR --;
Third equation, "ts 1/(LxSPDxR) CPD/(SPDxCT/(CT+CH))" should read
-- ts$\propto$ 1/(LxSPDxR)$\propto$CPD/(SPDxCT/(CT+CH)) --; and
Table 4, "5 pf" should read -- 5 pF --.

Column 15,
Line 26, "can not" should read -- cannot --; and
Equation, "Xr1 Yr1 21.2 μm    should read -- Xr1 $\simeq$ Yr1 $\simeq$ 21.2 μm Xr2 Yr2 42.3 μm"                    Xr2 $\simeq$ Yr2 $\simeq$ 42.3 μm --.

Column 16,
Lines 7 and 9, "21-1, 21-2," should read -- 21'-1, 21'-2, --;
Line 8, "21-N" should read -- 21'N --;
Line 10, "21-N" should read -- 21'-N --; and
Line 40, "with" should read -- while --.

Column 17,
Second equation, "VpLxSPDxtsxR" should read -- Vp$\propto$LxSPDxtsxR --;

UNITED STATES PATENT AND TRADEMARK OFFICE
CERTIFICATE OF CORRECTION

PATENT NO. : 6,531,690 B2
DATED : March 11, 2003
INVENTOR(S) : Hiraku Kozuka

It is certified that error appears in the above-identified patent and that said Letters Patent is hereby corrected as shown below:

<u>Column 18,</u>
Equation, "ts 1/(LxSPDxR) CFD/(SPDxCT/(CT+CH))" should read
-- ts∝1/(LxSPDxR)∝CFD/(SPDxCT/(CT+CH)) --; and
Line 57, "with" should read -- while --.

<u>Column 20,</u>
Line 14, "31*l*" should read -- 31'*l* --.

<u>Column 21,</u>
Line 61, "so" should read -- a so --; and
Line 62, "called a" should read -- called --.

<u>Column 23,</u>
Line 1, "away" should read -- array --.

<u>Column 24,</u>
Line 3, "Apparatus" should read -- An apparatus --.

Signed and Sealed this

Twentieth Day of January, 2004

JON W. DUDAS
*Acting Director of the United States Patent and Trademark Office*